US012764934B2

(12) United States Patent
Shang

(10) Patent No.: US 12,764,934 B2
(45) Date of Patent: Oct. 13, 2026

(54) MEMORY CELL WITH REDUCED PARASITIC CAPACITANCE

(71) Applicant: NANYA TECHNOLOGY CORPORATION, New Taipei City (TW)

(72) Inventor: Kai-Po Shang, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 456 days.

(21) Appl. No.: 18/127,774

(22) Filed: Mar. 29, 2023

(65) Prior Publication Data

US 2024/0334679 A1 Oct. 3, 2024

(51) Int. Cl.

| | |
|---|---|
| ***H10B 12/00*** | (2023.01) |
| ***H10W 10/00*** | (2026.01) |
| ***H10W 10/20*** | (2026.01) |
| ***H10W 20/00*** | (2026.01) |
| ***H10W 20/46*** | (2026.01) |

(52) U.S. Cl.

CPC ........... *H10B 12/34* (2023.02); *H10B 12/053* (2023.02); *H10W 10/021* (2026.01); *H10W 10/20* (2026.01); *H10W 20/071* (2026.01); *H10W 20/072* (2026.01); *H10W 20/074* (2026.01); *H10W 20/075* (2026.01); *H10W 20/076* (2026.01); *H10W 20/077* (2026.01);

(Continued)

(58) Field of Classification Search

None

See application file for complete search history.

(56) References Cited

U.S. PATENT DOCUMENTS

| | | | |
|---|---|---|---|
| 9,608,065 B1 | 3/2017 | Bergendahl et al. | |
| 2019/0296024 A1* | 9/2019 | Ji ........................ | H10B 12/488 |

(Continued)

FOREIGN PATENT DOCUMENTS

| | | |
|---|---|---|
| TW | 202218113 A | 5/2022 |
| TW | 202230633 A | 8/2022 |
| TW | 202234593 A | 9/2022 |

OTHER PUBLICATIONS

Office Action and Search Report mailed on Feb. 20, 2024 related to Taiwanese Application No. 112122398.

(Continued)

*Primary Examiner* — William Henry Anderson
(74) *Attorney, Agent, or Firm* — Xuan Zhang

(57) ABSTRACT

The present disclosure provides a memory device and a method of manufacturing the same. The memory device includes a substrate; a first gate electrode arranged within the substrate; a second gate electrode arranged within the substrate and over the first gate electrode; and a gate dielectric layer separating the substrate from the first gate electrode and the second gate electrode from the substrate. The gate dielectric layer includes: a first dielectric layer arranged within the substrate and laterally surrounding the first gate electrode; a second dielectric layer over the first dielectric layer and laterally surrounding the second gate electrode; and a low-k layer arranged over the first dielectric layer and laterally surrounded by the second dielectric layer, wherein the low-k layer has a dielectric constant less than that of the first dielectric layer or the second dielectric layer.

17 Claims, 32 Drawing Sheets

(52) U.S. Cl.
CPC ........... *H10W 20/46* (2026.01); *H10B 12/315* (2023.02); *H10B 12/488* (2023.02); *H10W 20/0765* (2026.01)

(56) References Cited

U.S. PATENT DOCUMENTS

| | | | | |
|---|---|---|---|---|
| 2021/0066466 | A1* | 3/2021 | Kwon | H10D 64/687 |
| 2021/0082767 | A1* | 3/2021 | Kim | H10B 12/053 |
| 2021/0242211 | A1* | 8/2021 | Huang | H01L 21/76802 |
| 2021/0242320 | A1* | 8/2021 | Huh | H10D 30/60 |
| 2022/0037328 | A1* | 2/2022 | Kim | H10B 12/053 |
| 2022/0223601 | A1* | 7/2022 | Lin | H10B 12/34 |
| 2022/0328491 | A1* | 10/2022 | Chang | H10B 12/34 |
| 2022/0376044 | A1 | 11/2022 | Yu et al. | |
| 2022/0406787 | A1* | 12/2022 | Park | H10B 12/34 |
| 2024/0206155 | A1* | 6/2024 | Huang | H10B 41/30 |

OTHER PUBLICATIONS

Office Action and Search Report mailed on Mar. 26, 2024 related to Taiwanese Application No. 113107763.

* cited by examiner

MEMORY CELL WITH REDUCED PARASITIC CAPACITANCE

TECHNICAL FIELD

The present disclosure relates to a memory cell and a method of manufacturing the memory cell. Particularly, the memory cell includes an insulation structure for reducing parasitic capacitance of the memory cells.

DISCUSSION OF THE BACKGROUND

As the semiconductor industry has progressed into advanced technology nodes in pursuit of greater device performance and a higher device density, dimensions of elements and distances between different elements have to be proportionally reduced. However, with the reductions in the dimensions of the elements and the distances between different elements, challenges of managing the desirable electrical and mechanical properties of the elements have arisen.

Memory devices, such as dynamic random access memory (DRAM) or static RAM (SRAM), have been widely adopted in the modern semiconductor applications. Among the issues of developing the memory device with smaller device size and greater functionality, leakage current in a control transistor of a memory cell is a challenging problem. Therefore, there is a need to develop an improved structure of the memory cells for effectively reducing the leakage current and saving more power of the memory device.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a memory device. The memory device includes: a substrate; a first gate electrode arranged within the substrate; a second gate electrode arranged within the substrate and over the first gate electrode; and a gate dielectric layer separating the substrate from the first gate electrode and the second gate electrode from the substrate. The gate dielectric layer includes: a first dielectric layer arranged within the substrate and laterally surrounding the first gate electrode; a second dielectric layer over the first dielectric layer and laterally surrounding the second gate electrode; and a low-k layer arranged over the first dielectric layer and laterally surrounded by the second dielectric layer, wherein the low-k layer has a dielectric constant less than that of the first dielectric layer or the second dielectric layer.

According to some embodiments of the present disclosure, the low-k layer includes an air gap.

According to some embodiments of the present disclosure, the gate dielectric layer further includes a third dielectric layer disposed over the low-k layer and the second dielectric layer.

According to some embodiments of the present disclosure, the memory device further includes a capping layer arranged over the second gate electrode, wherein the third dielectric layer covers the capping layer.

According to some embodiments of the present disclosure, the memory device further includes a fourth dielectric layer between the capping layer and the low-k layer, wherein the fourth dielectric layer has a dielectric constant less than that of the first dielectric layer or the second dielectric layer.

According to some embodiments of the present disclosure, the low-k layer fills a space between the second dielectric layer and the fourth dielectric layer.

According to some embodiments of the present disclosure, the second dielectric layer and the fourth dielectric layer are formed of a same dielectric material.

According to some embodiments of the present disclosure, the third dielectric layer extends over upper surfaces of the low-k layer and the second dielectric layer.

According to some embodiments of the present disclosure, the third dielectric layer has a first thickness directly over the low-k layer and a second thickness directly over the second dielectric layer, wherein the first thickness is greater than the second thickness.

According to some embodiments of the present disclosure, the memory device further includes a barrier layer laterally surrounding the first gate electrode and laterally surrounded by the low-k layer and the second dielectric layer.

One aspect of the present disclosure provides a memory device. The memory device includes: a substrate; a first gate electrode arranged within the substrate; a capping layer arranged within the substrate and over the first gate electrode; a first dielectric layer laterally surrounding the capping layer; a second dielectric layer laterally surrounding the capping layer and laterally surrounded by the first dielectric layer, and an air gap between the first dielectric layer and the second dielectric layer.

According to some embodiments of the present disclosure, the first dielectric layer has a dielectric constant greater than that of the second dielectric layer.

According to some embodiments of the present disclosure, the second dielectric layer includes silicon-carbon oxide.

According to some embodiments of the present disclosure, the air gap extends below the second dielectric layer and separates the first dielectric layer from the second dielectric layer.

According to some embodiments of the present disclosure, the memory device further includes a second gate electrode arranged between the first gate electrode and the capping layer, wherein the second gate electrode is in fluid communication with the air gap.

According to some embodiments of the present disclosure, a lower surface of the second gate electrode is coplanar with a lower surface of the first dielectric layer.

According to some embodiments of the present disclosure, the memory device further includes a third dielectric layer below the first and second dielectric layer and the second gate electrode and laterally surrounding the first gate electrode.

According to some embodiments of the present disclosure, the memory device further includes a barrier layer between the third dielectric layer and the first gate electrode.

According to some embodiments of the present disclosure, the barrier layer is arranged below the first dielectric layer and is covered by the first dielectric layer.

According to some embodiments of the present disclosure, the memory device further includes a source/drain region disposed in the substrate on one side of the first dielectric layer, wherein the source/drain region has a bottom lower than a lower surface of the first dielectric layer.

One aspect of the present disclosure provides a method of manufacturing a memory device. The method includes: providing a substrate including an upper surface; performing a first etching operation to form a first trench in the substrate; depositing a first dielectric layer on sidewalls of the first trench; forming a first gate electrode in the first trench and laterally surrounded by the first dielectric layer; depositing a second dielectric layer and forming a low-k layer in the first trench over the first gate electrode, wherein the low-k layer includes a dielectric constant less than that of the first dielectric layer and the second dielectric layer; depositing a capping layer over the first gate electrode to fill the first trench; and depositing a third dielectric layer to cover the low-k layer.

According to some embodiments of the present disclosure, the low-k layer includes an air gap.

According to some embodiments of the present disclosure, the depositing of the third dielectric layer is performed using chemical vapor deposition to close the air gap.

According to some embodiments of the present disclosure, the third dielectric layer includes non-uniform thicknesses across a first location over the air gap and a second location over the capping layer or the second dielectric layer.

According to some embodiments of the present disclosure, the method further includes depositing a sacrificial layer over the second dielectric layer prior to the depositing of the capping layer.

According to some embodiments of the present disclosure, the second dielectric layer separates the sacrificial layer from the first dielectric layer.

According to some embodiments of the present disclosure, the method further includes depositing a fourth dielectric layer on the sacrificial layer prior to the forming of the low-k layer.

According to some embodiments of the present disclosure, the fourth dielectric layer has a dielectric constant less than that of the first dielectric layer, the second dielectric layer or the third dielectric layer, but greater than that of the low-k layer.

According to some embodiments of the present disclosure, the fourth dielectric layer includes silicon-carbon oxide.

According to some embodiments of the present disclosure, the method further includes performing a patterning operation on the second dielectric layer, the sacrificial layer and the fourth dielectric layer to expose the first gate electrode.

According to some embodiments of the present disclosure, the method further includes depositing a second gate electrode over the first gate electrode subsequent to the patterning operation and prior to the depositing of the capping layer.

According to some embodiments of the present disclosure, the depositing of the capping layer is performed subsequent to the patterning operation.

According to some embodiments of the present disclosure, the depositing of the capping layer is performed prior to the depositing of the second dielectric layer.

According to some embodiments of the present disclosure, the method further includes etching an upper portion of the first dielectric layer to form a second trench, wherein the second dielectric layer and the low-k layer are formed in the second trench.

Through the design of an air gap or a low-k layer disposed in a space formed in the gate dielectric layer, the effective dielectric constant of the gate dielectric layer can be lowered. The parasitic capacitance and the accompanying electrical field can be reduced. As a result, the leakage current and operation speed of the memory cell can be improved, and the performance of the memory cell can be enhanced accordingly.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1A:
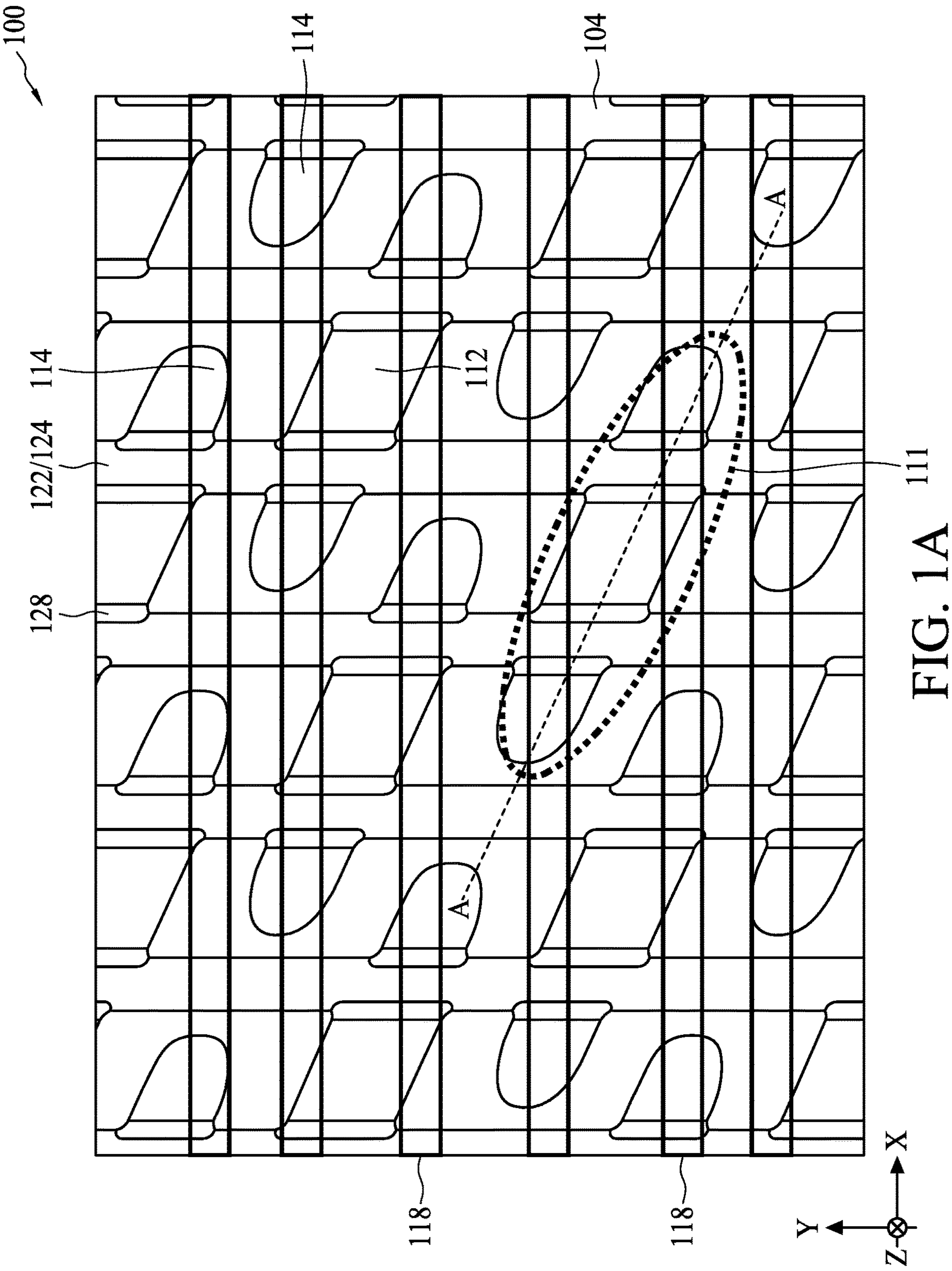
FIGS. 1A and 1B are a top view and a cross-sectional view, respectively, of a memory array, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

The terms "couple" or "connect" used throughout the present disclosure refers to physical or electrical linkage between two or more objects. These objects may also be referred to as being "coupled" or "connected" through exchange of data or information. These "coupled" or "connected" objects may be in direct contact in some cases or indirect contact through other intervening objects.

Embodiments of the present disclosure discuss a memory array formed of a plurality of memory cells and a method of forming a memory array. Among the various types of the memory devices, dynamic random access memory (DRAM) has drawn a lot of acceptance and applications in a pyramid of modern electronic devices for its low cost and good access efficiency. According to some embodiments of the present disclosure, a dual work-function gate electrode framework, or alternatively, a dual work-function framework, is adopted for forming the word line (or equivalently the gate electrode) of each of the memory cells to improve the electrical performance of the memory cells. However, during the manufacturing process of the memory array with the dual work-function word line, a parasitic capacitor with unnoticeable capacitance is formed in a sandwich structure constructed by the source/drain regions, the gate dielectric layer and the dual work function word line. As a result, the accessing speed of the memory cells may be reduced resulting from the parasitic capacitance. The performance of the memory array may deteriorate accordingly.

To address the abovementioned issues, a method of reducing the dielectricity of the gate dielectric layer is proposed. A low dielectric constant (low-k) material, e.g., air or other suitable low-k dielectric material, is used to replace the existing dielectric materials of portions of the gate dielectric layer adjacent to the source/drain regions. As a result, the lowered electrical field and capacitance resulting from the low-k dielectric material can effectively improve the accessing speed of the memory cell. Thus, the performance of the memory cell can be lifted without incurring an additional cost.

Figure 1B:
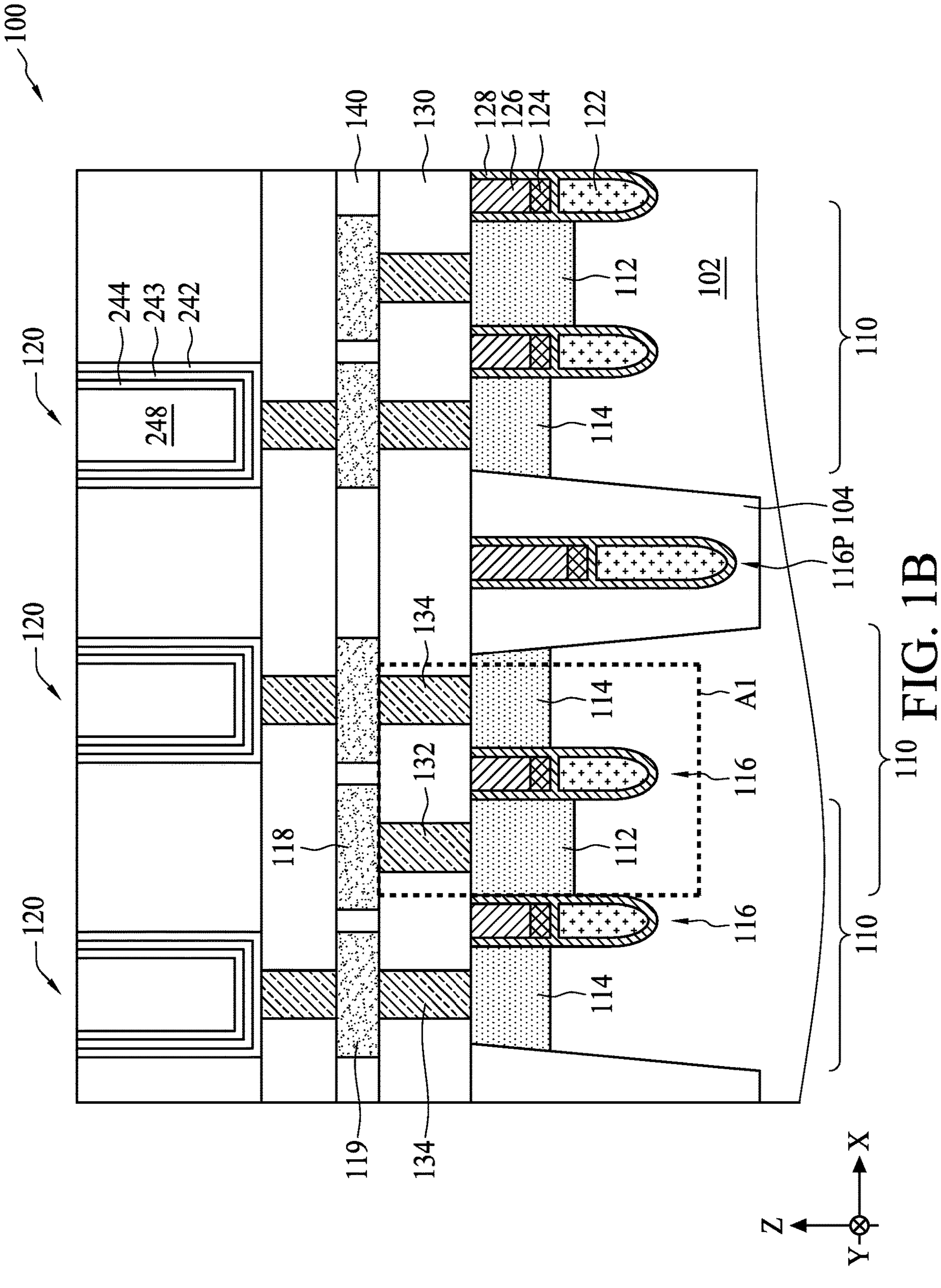

FIGS. 1A and 1B are a top view and a cross-sectional view, respectively, of a memory array 100, in accordance with some embodiments of the present disclosure. The cross-sectional view is taken along a sectional line AA in FIG. 1A. According to some embodiments of the present disclosure, the memory array 100 is formed of DRAM cells. A DRAM cell, e.g., represented by a memory cell 110 shown in FIG. 1B, is generally formed of a memory unit 120 configured to store data information and a control unit configured to perform the access operations on the memory unit, such as a read operation and a write operation. According to some embodiments of the present disclosure, the memory unit 120 is implemented by a capacitor. For example, the capacitor of the memory unit 120 is constructed by a first conductive plate 242, a second conductive plate and an insulating film 243 between the first and second conductive plates 242, 244. According to some embodiments, the first conductive plate 242 and the second conductive plate 244 are formed of conductive materials, such as tungsten, aluminum, titanium, tantalum, gold, silver, copper, alloys thereof, or the like. The insulating film 243 may be formed of a dielectric material, such as silicon oxide, silicon nitride, silicon carbide, silicon oxynitride, high-k dielectric materials or other suitable dielectric materials. The high-k dielectric materials may include $HfO_2$, HfErO, HfLaO, HfYO, HfGdO, HfAlO, HfZrO, HfTiO, HfTaO, $ZrO_2$, $Y_2O_3$, $La_2O_5$, $Gd_2O_5$, $TiO_2$, $Ta_2O_5$, SrTiO, or combinations thereof.

The memory unit 120 may also include a filling material filling a trench formed by the first conductive plate 242, the insulating film 243 and the second conductive plate 244. The filling material 248 may be laterally surrounded by the first conductive plate 242, the insulating film 243 and the second conductive plate 244. The filling material 248 may be formed of a dielectric material, such as silicon oxide, silicon nitride, silicon carbide, silicon oxynitride, high-k dielectric materials or other suitable dielectric materials. The high-k dielectric materials may include $HfO_2$, HfErO, HfLaO, HfYO, HfGdO, HfAlO, HfZrO, HfTiO, HfTaO, $ZrO_2$, $Y_2O_3$, $La_2O_5$, $Gd_2O_5$, $TiO_2$, $Ta_2O_5$, SrTiO, or combinations thereof. According to some embodiments of the present disclosure, the filling material 248 has a material similar to the insulating film 243.

The control unit of each memory cell 110 is usually implemented by a transistor, e.g., field-effect transistor (FET), such as metal-oxide semiconductor (MOS) FET (MOSFET). According to different architectures of the transistors, the control unit of the memory cell 110 can be formed of a planar FET or a buried-gate FET. However, other types of FET, e.g., a fin-type FET (FinFET), a gate-all-around (GAA) FET, nanosheet FET, nanowire FET, or the like, are also within the contemplated scope of the present disclosure.

Referring to FIGS. 1A and 1B, the memory array 100 includes a plurality of control units, in which each control unit includes an active region (AR) 111 formed in a substrate 102. The plurality of active regions 111 are arranged parallel to each other from a top-view perspective. According to some embodiments of the present disclosure, the active regions 111 have an oval or ellipse shape extending in the XY-plane from a top-view perspective. The active regions 111 are formed to include source/drain region therein for each control unit. According to some embodiments of the present disclosure, the memory array 100 further includes isolation regions 104 defining and electrically separating the active regions 111. According to some embodiments of the present disclosure, the isolation regions 104 are formed of a dielectric material, such as silicon oxide, silicon nitride, silicon carbide, silicon oxynitride, or other suitable dielectric materials.

According to some embodiments of the present disclosure, the memory array 100 also includes a plurality of word lines 116 extending along the Z-axis in the substrate 102. The word lines 116 may extend along the Y-axis and cross adjacent active regions 111, in which the gate electrodes 122, 124 and the source/drain regions on two sides of the respective word line 116 collectively form a transistor or a control unit of a memory cell 110. According to some embodiments, each transistor further includes a gate dielectric layer 128 laterally surrounding the word line 116. The gate dielectric layer 128 serves as an insulating structure between the channel of the transistor and the gate electrodes 122, 124 in each memory cell 110. The gate dielectric layer 128 may be formed of a dielectric material, such as such as silicon oxide, silicon nitride, silicon carbide, silicon oxynitride, a high-k dielectric material, or other suitable dielectric materials. The high-k dielectric material may include $HfO_2$, HfErO, HfLaO, HfYO, HfGdO, HfAlO, HfZrO, HfTiO, HfTaO, $ZrO_2$, $Y_2O_3$, $La_2O_5$, $Gd_2O_5$, $TiO_2$, $Ta_2O_5$, SrTiO, or combinations thereof.

According to some embodiments of the present disclosure, the memory array 100 further includes a plurality of bit lines 118 extending over the substrate 102. The bit lines 118 may extend along the X-axis from a top-view perspective and may be substantially perpendicular word lines 116. The bit lines 118 are electrically coupled to one of the source/drain regions 112, 114 of the respective transistors. Similarly, the memory array 100 may further include a plurality of source lines (not separately shown in FIG. 1A, but illustrated in FIG. 1B as a reference numeral 119) over the substrate 102 to be electrically coupled to the other source/drain region 112 or 114 of each of the transistors. The source lines 119 may extend along the X-axis and parallel to the bit lines 118. According to some embodiments of the present disclosure, an angle is formed between the word lines 116 and the active regions from a top-view perspective, in which the angle is not a right angle to increase the routing efficiency of the word lines 116, the bit lines and the source lines 119.

According to some embodiments of the present disclosure, referring to FIG. 1B, a word line 116 enclosed by the isolation region is referred to as a passing word line 116P. The passing word line 116P is configured as non-functional word lines 116, and is electrically isolated from other features of the memory array 100 by the surrounding isolation regions 104. According to some embodiments of the present disclosure, other four example word lines 116 not enclosed by the isolation regions 104 are formed in the active regions 111 and disposed immediately adjacent to the respective source/drain regions 112, 114. Therefore, these word lines 116 are also referred to as active word lines 116. The active word lines 116 are configured as functional word lines 116 and serve as gate electrodes of the respective transistors for the respective memory cells 110.

Referring to FIG. 1B, according to some embodiments of the present disclosure, a first dielectric layer 130 and a second dielectric layer 140 are successively formed over the substrate 102. According to some embodiments of the present disclosure, the first dielectric layer and the second dielectric layer 140 each are formed of a dielectric material, such as silicon oxide, silicon nitride, silicon oxynitride, silicon carbide, or the like. According to some embodiments of the present disclosure, each of the first dielectric layer 130 and the second dielectric layer 140 includes a monolayer structure or a multilayer structure. According to some embodiments of the present disclosure, conductive vias 132 are formed through the first dielectric layer 130 and electrically coupling the source/drain regions 112 to the corresponding bit lines 118. According to some embodiments of the present disclosure, conductive vias 134 are formed through the first dielectric layer 130 and the second dielectric layer 140, and electrically couple the source/drain regions 114 to the corresponding source lines 119. Although not separately shown, the memory array 100 may further include a plurality of conductive vias formed within the first dielectric layer 130 or the second dielectric layer 140 to electrically couple the gate electrodes 122, 124 of the word lines 116 to corresponding voltage sources (not separately shown) for receiving biasing voltages.

According to some embodiments of the present disclosure, the bit lines 118, source lines 119 and conductive vias 132, 134 are formed of conductive materials, such as tungsten, aluminum, titanium, tantalum, gold, silver, copper, alloys thereof, or the like. According to some embodiments of the present disclosure, the bit lines 118, source lines 119, conductive vias 132 and 134 are formed using lithography, etching and deposition operations. According to some embodiments of the present disclosure, the etching operations include a dry etch, a wet etch, a combination thereof (e.g., reactive ion etch, RIE), or the like. The deposition operations may include chemical vapor deposition (CVD), physical vapor deposition (PVD), atomic layer deposition (ALD), or other suitable deposition methods.

According to some embodiments of the present disclosure, each of the word lines 116 is formed of a first gate electrode 122, a second gate electrode 124, a barrier layer 210, a capping layer 228 and a gate dielectric layer 128. According to some embodiments of the present disclosure, the gate dielectric layer 128 is configured to electrically insulate the first gate electrode 122 and the second gate electrode 124 from the substrate 102. According to some embodiments of the present disclosure, the gate dielectric layer 128 extends between the first gate electrode 122 and the second gate electrode 124 to electrically insulate the first gate electrode 122 from the second gate electrode 124.

According to some embodiments of the present disclosure, the first gate electrode 122 and the second gate electrode 124 are formed of different materials to provide different work functions, e.g., the first gate electrode 122 is formed of a metal gate and comprised of one or more metallic materials, while the second gate electrode 124 is formed of doped polysilicon. The gate electrodes 122 and 124 with different work functions may lead to different electric field distributions in the vicinity of the word lines 116 during an access operation, and the leakage level, e.g., an effect known as the gate-induced device leakage (GIDL), can be controlled better. According to some embodiments of the present disclosure, one of the first gate electrode 122 and the second gate electrode 124 is omitted from the word line 116, and thus only a single work-function gate electrode is used in the word line 116.

According to some embodiments of the present disclosure, the barrier layer 210 extends between the gate dielectric layer 128 and the first gate electrode 122, the second gate electrode 124 or the capping layer 228. The barrier layer 210 may prevent materials of the first gate electrode 122 or the second gate electrode 124 from diffusing into the substrate 102 through the gate dielectric layer 128. The barrier layer may include titanium nitride, tantalum nitride, or the like.

According to some embodiments, the gate dielectric layer 128 includes different portions formed of different materials. These different materials may include different dielectric constants. Although FIG. 1B shows that the gate dielectric layer 128 includes a uniform material disposed between the substrate 102 and the gate electrodes 122, 124 and the capping layer 228, the present disclosure is not limited thereto. A multi-section (at least two-section) gate dielectric layer 128 is introduced to enhance the parasitic capacitance of the memory cell 110, details of which are provided below.

Figure 2:
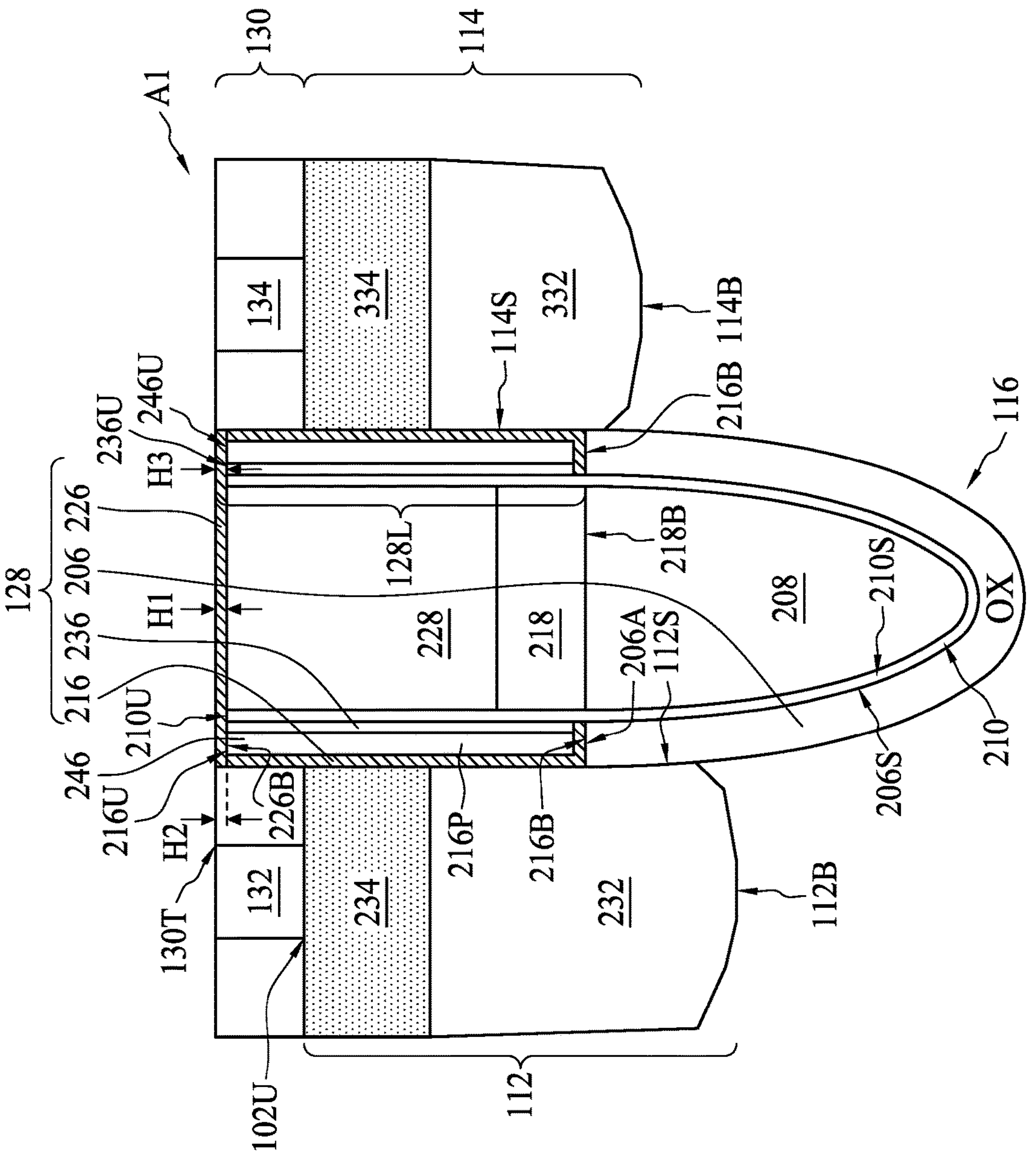
FIG. 2 is an enlarged view of a portion of the memory array shown in FIG. 1B, in accordance with some embodiments of the present disclosure.

FIG. 2 is an enlarged view of a portion A1 of the memory array 100 shown in FIG. 1A, in accordance with some embodiments of the present disclosure. Referring to FIG. 2, the portion A1 illustrates a memory cell 110 (excluding the memory unit), including the word line 116 and the source/drain regions 112, 114. According to some embodiments of the present disclosure, the gate dielectric layer is formed of a first insulating layer 206, a second insulating layer 216, a third insulating layer 226, a fourth insulating layer 236 and a fifth insulating layer 246, which also are referred to herein a first dielectric layer 206, a second dielectric layer 216, a third dielectric layer 226, a fourth dielectric layer 236, and a low-k (low dielectric constant) layer 246, respectively. According to some embodiments of the present disclosure, at least one or more of the first dielectric layer 206, the second dielectric layer 216, the third dielectric layer 226, the fourth dielectric layer 236 and the low-k layer 246 are configured as the gate dielectric layer of the transistor of the memory cell 110. According to some embodiments of the present disclosure, the second dielectric layer 216, the third dielectric layer 226 and the fourth dielectric layer 236 are formed of the same dielectric material, e.g., silicon nitride. According to some embodiments of the present disclosure, the first dielectric layer 206, the fourth dielectric layer 236 or the low-k layer 246 is formed of a material different from the second dielectric layer 216 and the third dielectric layer 226. Throughout the present disclosure, the low-k layer 246 has a relatively lower dielectric constant than most of the dielectric materials. The low-k layer 246 may include air gap.

According to some embodiments of the present disclosure, the first dielectric layer 206 is formed of a material, e.g., silicon oxide, different from the low-k layer 246, e.g., silicon-carbon oxide (SiCO) or air. According to some embodiments of the present disclosure, the second dielectric layer 216, the third dielectric layer 226 and the fourth dielectric layer 236 are formed of silicon nitride, air and SiCO, respectively; or they are formed of silicon nitride, SiCO and silicon nitride, respectively. According to some embodiments of the present disclosure, the first dielectric layer 206, the second dielectric layer 216, the fourth dielectric layer 236 are deposited in a conformal manner.

According to some embodiments of the present disclosure, the second dielectric layer 216 has an L-shape extending from the sidewall 112S, 114S of the source/drain regions 112, 114 to the upper surface 206A of the first dielectric layer 206. The horizontal portion of the second dielectric layer 216 extending over the first dielectric layer 206 may be joined to the bottom portion of the fourth dielectric layer 236. According to some embodiments, a portion of the low-k layer 246 separates the second dielectric layer 216 from the fourth dielectric layer 236. According to some embodiments, the low-k layer 246 is in contact with the second gate electrode 218 or separated from the second gate electrode 218 by the fourth dielectric layer 236.

According to some embodiments of the present disclosure, a channel is formed in the substrate 102 between the source/drain region and the source/drain region 114 along the area of the substrate 102 adjacent to the lower portion of the gate dielectric layer 128, in which carriers are moved by the electric fields generated by the first gate electrode 208 and the second gate electrode 218. According to some embodiments of the present disclosure, the total electrical field around the channel of the memory cell 110 is formed collectively by the first gate electrode 208 and the second gate electrode 218 with different work functions. Further, the parasitic capacitance and the accompanying electric field associated with the gate dielectric layer may be different in different portions of the gate dielectric layer according to different dielectric constants of the dielectric layers 206, 216, 226, 236 and 246. According to some embodiments of the present disclosure, the low-k layer 246 is formed of air or replaced with a dielectric layer SiCO, which has a dielectric constant lower than that of the first dielectric layer 206, the second dielectric layer 216, the third dielectric layer 226 or the fourth dielectric layer 236. As a result, the overall electric field contributed by the gate dielectric layer 128 can be lowered due to the presence of the low-k layer 246, and therefore the leakage current can be effectively managed.

According to some embodiments of the present disclosure, the source/drain region 112 is formed of a first doped region 232 and a second doped region 234. According to some embodiments of the present disclosure, the first doped region 232 or the second doped region 234 is doped with a dopant conductivity different from that of the substrate 102, e.g., the substrate 102 may be doped with P-type dopants, such as boron, gallium or the like, while the first doped region or the second doped region 234 is doped with N-type dopants, such as phosphorus, arsenic, or the like. According to some embodiments of the present disclosure, the first doped region 232 has a doping concentration less than that of the second doped region 234. For example, the first doped region 232 has a doping concentration in a range between about 1E12 and about 1E13 atoms/$cm^3$, while the second doped region 234 has a doping concentration in a range between about 1E14 and about 1E15 atoms/$cm^3$.

According to some embodiments of the present disclosure, the source/drain region 114 is formed of a first doped region 332 and a second doped region 334. According to some embodiments of the present disclosure, the first doped region 332 or the second doped region 334 is doped with a dopant conductivity different from that of the substrate 102, e.g., the substrate 102 may be doped with P-type dopants, such as boron, gallium or the like, while the first doped region or the second doped region 334 is doped with N-type dopants, such as phosphorus, arsenic, or the like. According to some embodiments of the present disclosure, the first doped region 332 has a doping concentration less than that of the second doped region 334. For example, the first doped region 332 has a doping concentration in a range between about 1E12 and about 1E13 atoms/$cm^3$, while the second doped region 334 has a doping concentration in a range between about 1E14 and about 1E15 atoms/$cm^3$. According to some embodiments of the present disclosure, the source/drain region 114 has a depth less than the depth of the source/drain region 112.

Referring to FIG. 1B and FIG. 2, two adjacent memory cells between two adjacent passing word lines 116P or between two isolation regions 104 include two active word lines 116, one common source/drain region 112 and two source/drain regions 114. The common source/drain region 112, referred to herein as the drain region 112, is shared by the two adjacent memory cells 110, and the source/drain regions 114, referred to herein as the source regions 114, are associated with the respective transistors. By help of the sharing of the drain region 112 for the adjacent memory cells 110, the device size can be further reduced.

According to some embodiments of the present disclosure, the memory cell 110 includes a capping layer 228 formed over the second gate electrode 218. According to some embodiments of the present disclosure, the capping layer 228 is a dielectric layer formed of a dielectric material different from the first dielectric layer 206 and the low-k layer 246. For example, the capping layer 228 is formed of silicon nitride. According to some embodiments of the present disclosure, a portion of the first dielectric layer 206 extends between the second gate electrode 218 and the capping layer 228. According to some embodiments of the present disclosure, the capping layer 228 physically contacts the second gate electrode 218. According to some embodiments of the present disclosure, the low-k layer 246 fills a space 216P of the gate dielectric layer 128 between the second dielectric layer and the fourth dielectric layer 236.

The upper surface 228U of the capping layer 228 may be coplanar with the upper surface 216U of the second dielectric layer 216, the upper surface 236U of the fourth dielectric layer 236, the upper surface 246U of the low-k layer 246 and the upper surface 210U of the barrier layer 210. According to some embodiments of the present disclosure, the third dielectric layer 226 covers the entire upper surface 228U of the capping layer 228, the entire upper surface 216U of the second dielectric layer 216, the entire upper surface 236U of the fourth dielectric layer 236, the entire upper surface 246U of the low-k layer 246, and the entire upper surface 210U of the barrier layer 210.

According to some embodiments of the present disclosure, the second dielectric layer 216 or a portion of the first dielectric layer 206 lines a sidewall 112S or 114S of the source/drain region 112 or 114. The second dielectric layer 216 laterally surrounds the first gate electrode 208 and the capping layer 228. According to some embodiments of the present disclosure, an inner sidewall 206S of the first dielectric layer 206 physically contacts a sidewall 210S of the barrier layer 210.

According to some embodiments of the present disclosure, the second dielectric layer 216 may have a lower portion extending beneath the fourth dielectric layer 236. According to some embodiments of the present disclosure, a lower surface 218B of the second gate electrode is coplanar with a bottom surface 216B of the second dielectric layer 216. According to some embodiments of the present disclosure, a bottom 112B or 114B of the source/drain region 112 or 114 is lower than the lower surface 218B of the second gate electrode 218.

According to some embodiments of the present disclosure, the barrier layer 210 at least partially laterally surrounds the first gate electrode 208, the second gate electrode 218 and the capping layer 228. According to some embodiments of the present disclosure, the barrier layer 210 is in physical contact with the second dielectric layer 216 and the fourth dielectric layer 236.

According to some embodiments of the present disclosure, the second dielectric layer 216 and the fourth dielectric layer 236 of the gate dielectric layer 128 have a height 128L over the first dielectric layer 206 in the Z-axis. The low-k layer 246 is surrounded or wrapped around by the second dielectric layer 216, the third dielectric layer 226 and the fourth dielectric layer 236. According to some embodiments, the lower surface 226B of the third dielectric layer 226 may not be coplanar with the upper surface 228U of the capping layer 228 or the upper surface 236U of the fourth dielectric layer 236, but may extend to the depth of the low-k layer 246. As a result, the lower surface 226B of the third dielectric layer 226 may be lower than the upper surface 228U of the capping layer 228, the upper surface 216U of the second dielectric layer 216, or the upper surface 236U of the fourth dielectric layer 236. According to some embodiments of the present disclosure, the thickness of the third dielectric layer 226 is not uniform on the upper surfaces 210U, 216U, 236U and 246U. The thickness H2 of portions of the third dielectric layer 226 directly above the upper surface 246U of the low-k layer 246 may be greater than that of portions H3 of the third dielectric layer 226 directly over the upper surfaces 210U, 216U, 236U and greater than portions H1 of the third dielectric layer 226 directly above the capping layer 228.

Figure 3A:
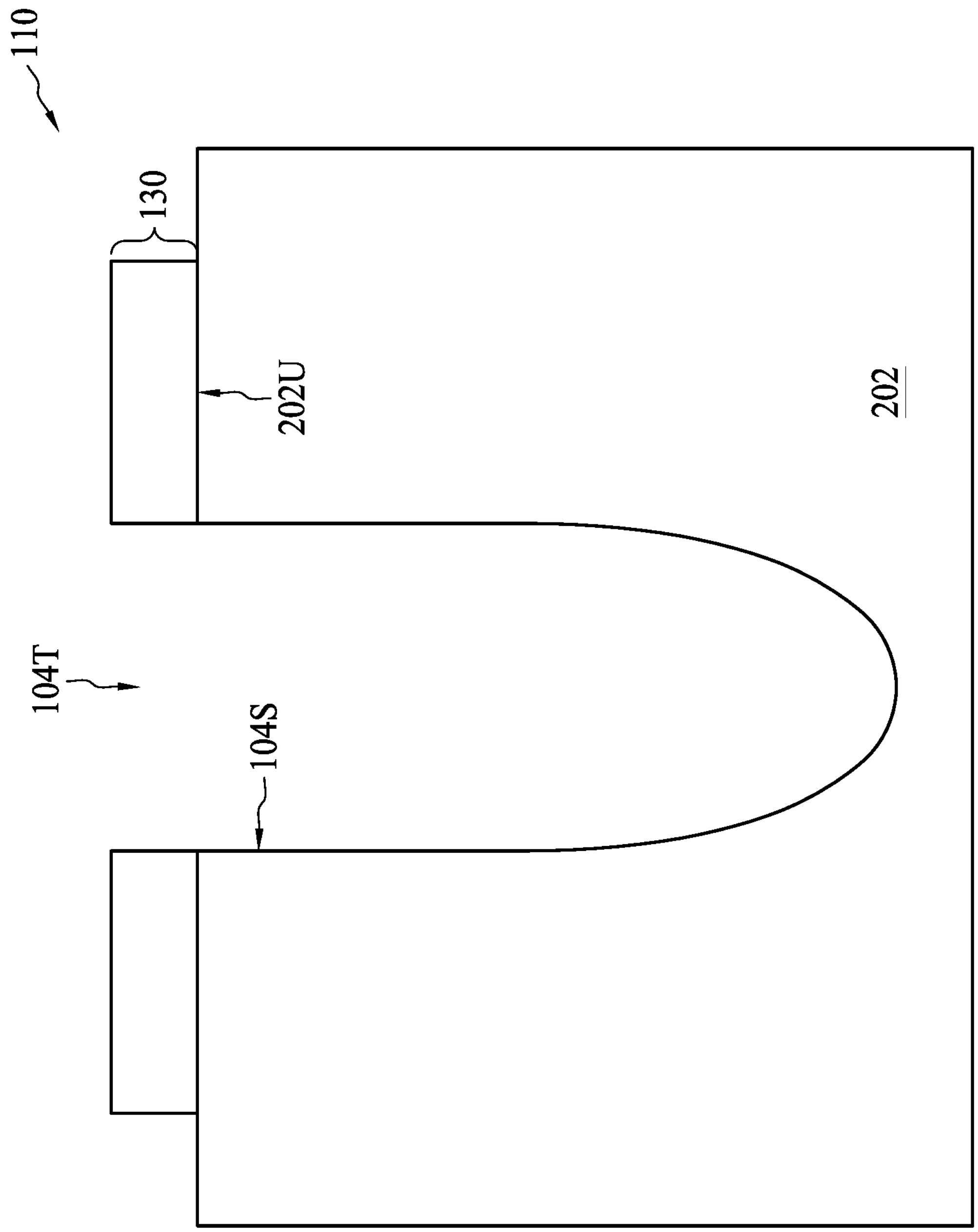
FIGS. 3A to 3N are schematic cross-sectional views of intermediate stages of a method of forming a memory cell shown in FIG. 2, in accordance with some embodiments of the present disclosure.
Figure 3B:
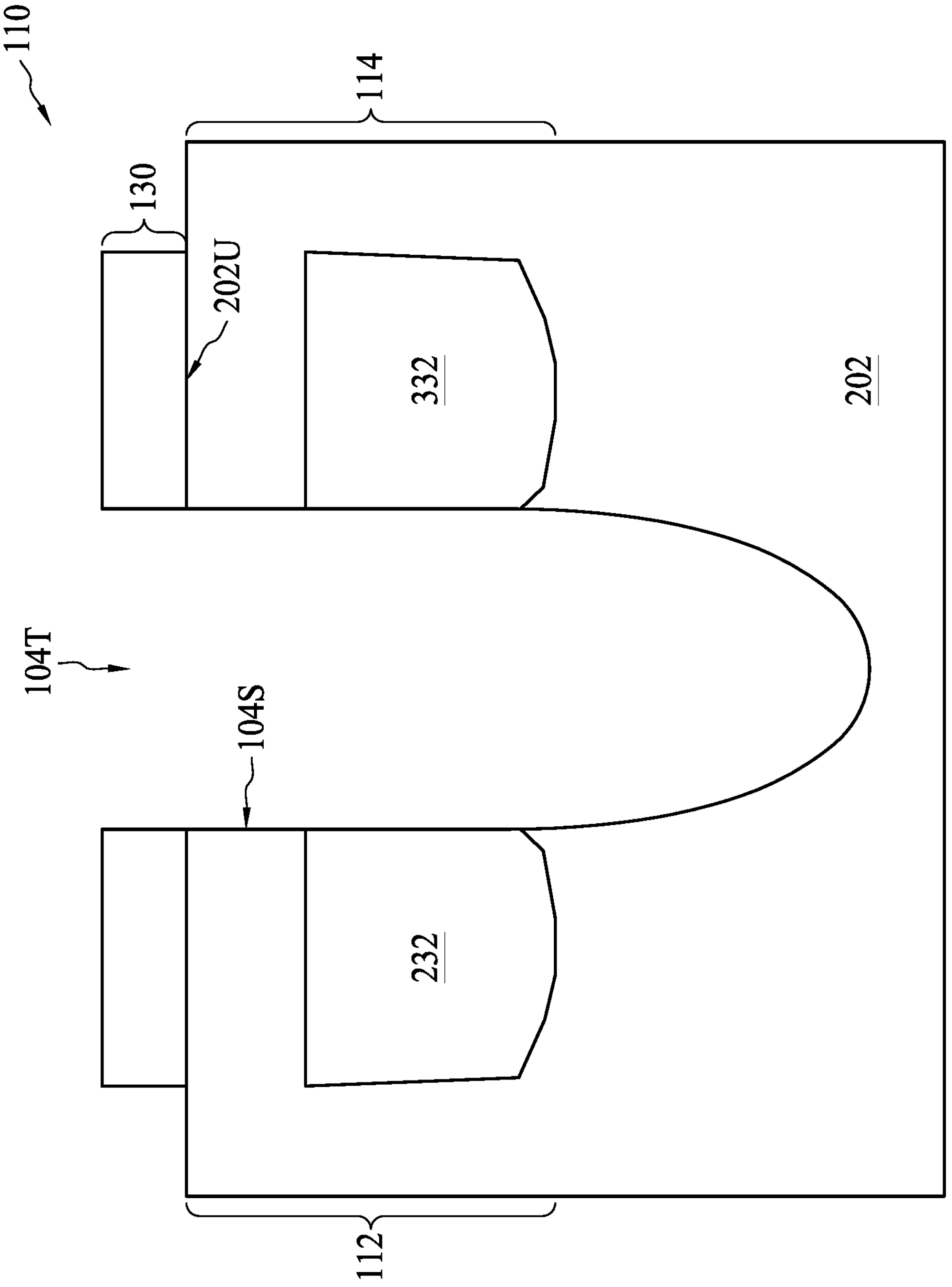
Figure 3C:
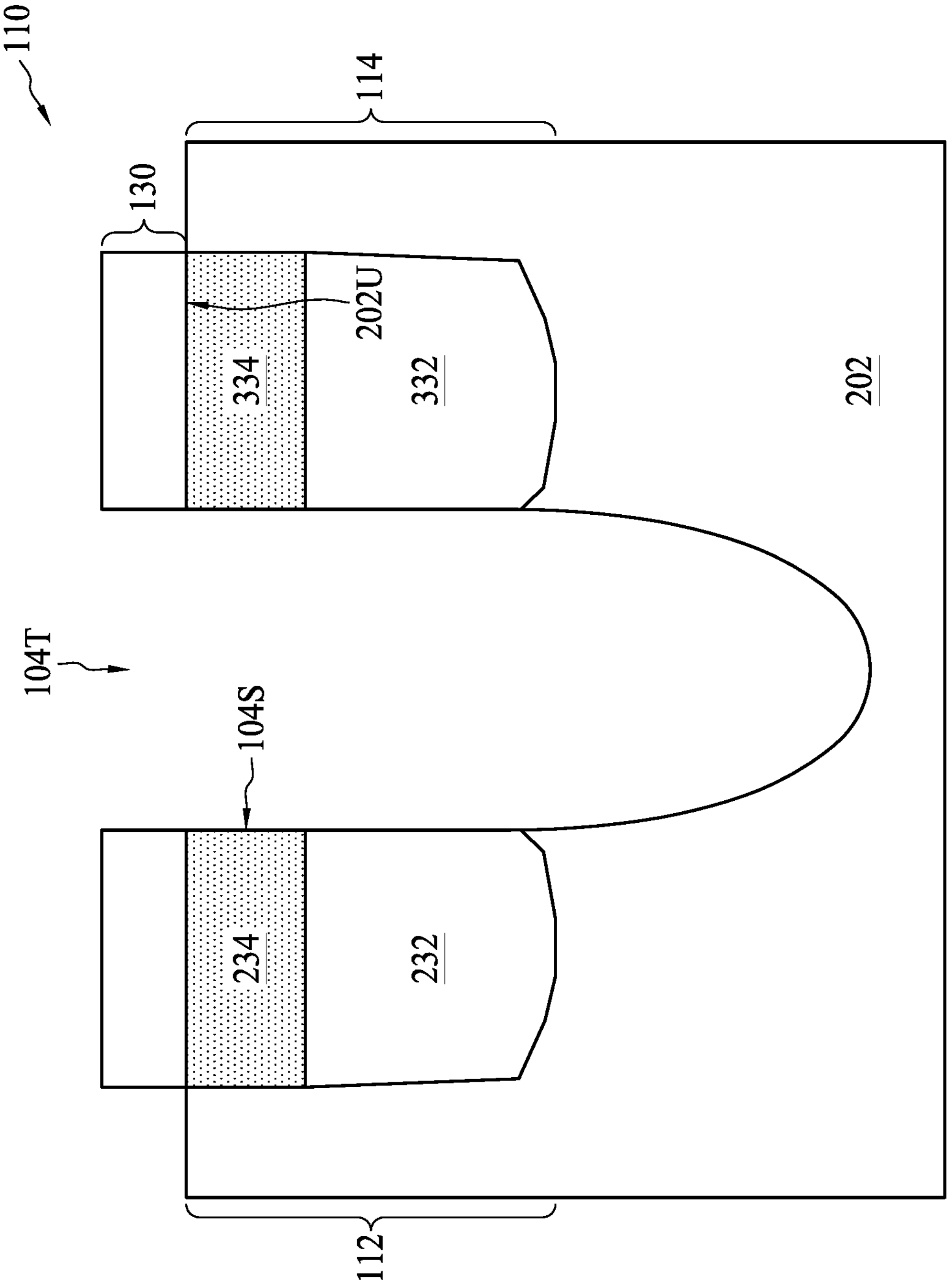
Figure 3D:
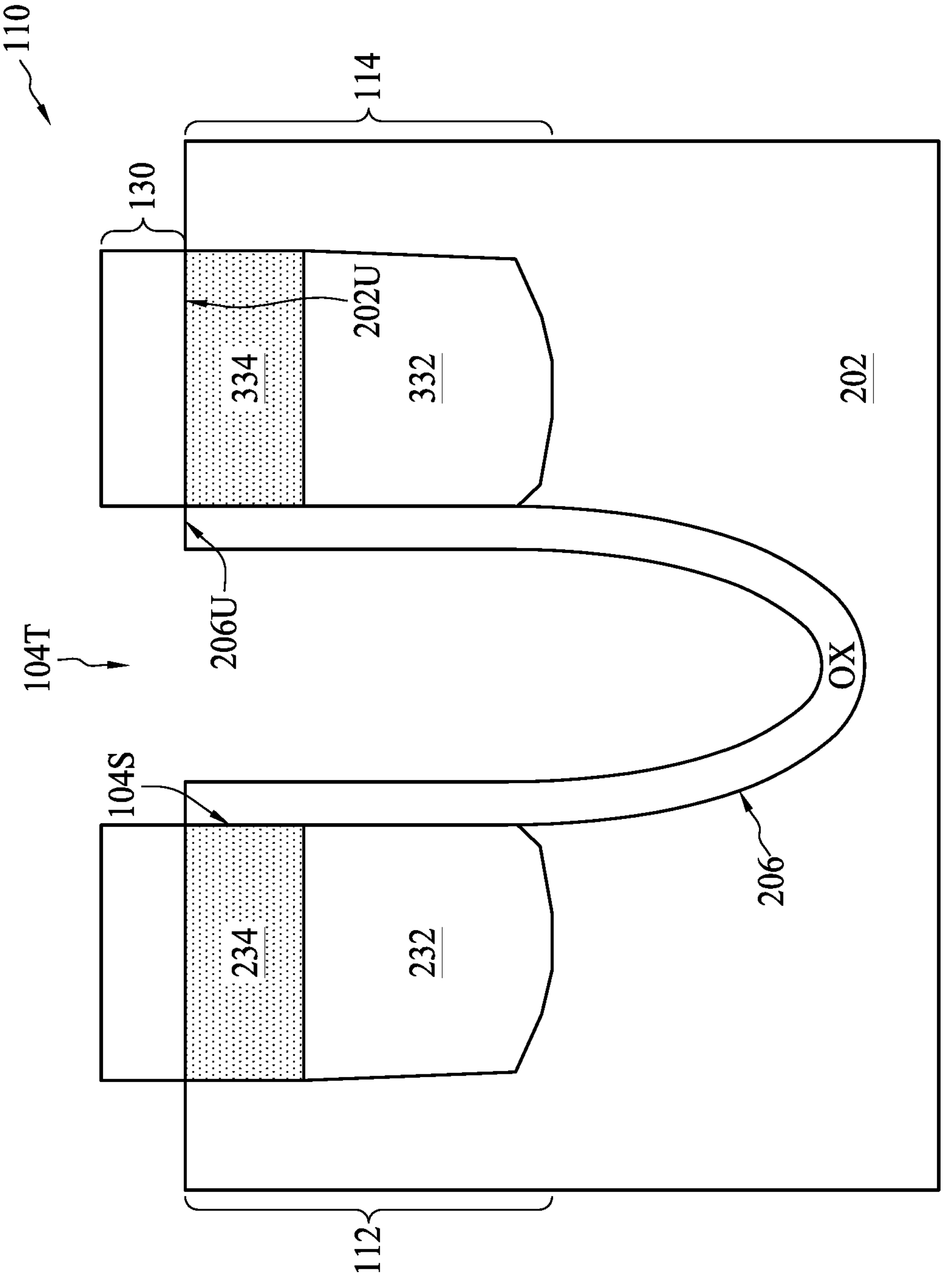
Figure 3E:
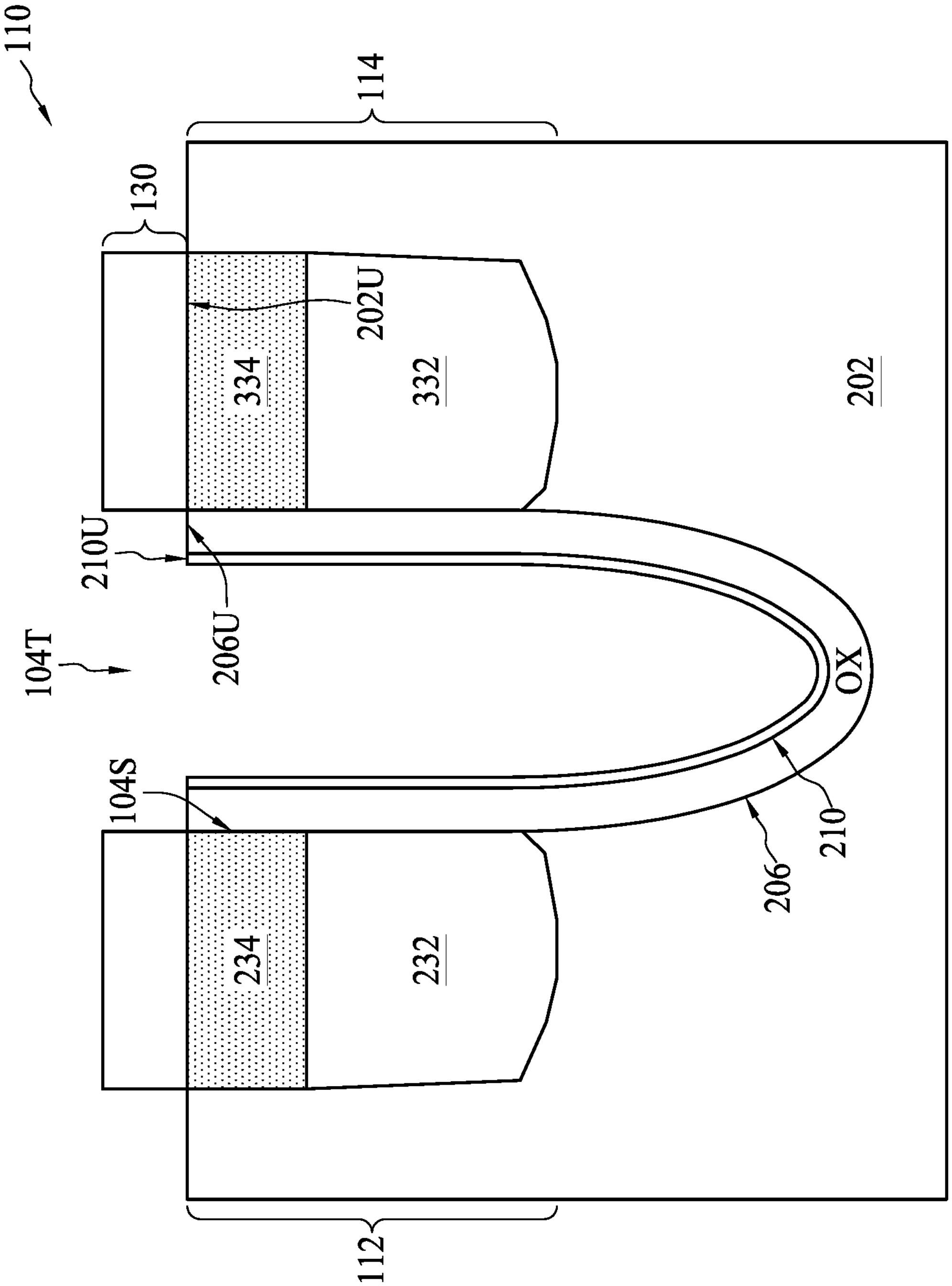
Figure 3F:
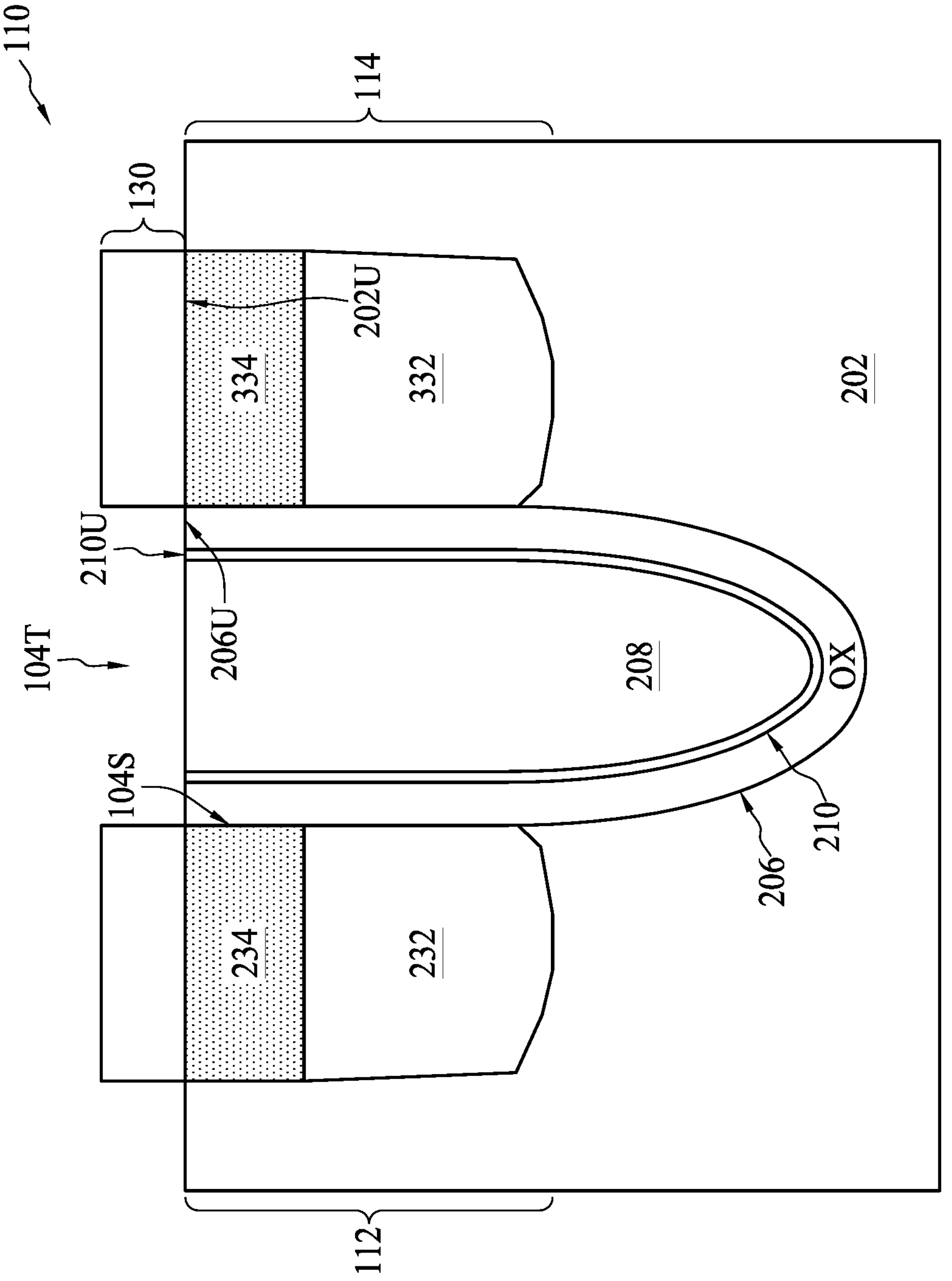
Figure 3G:
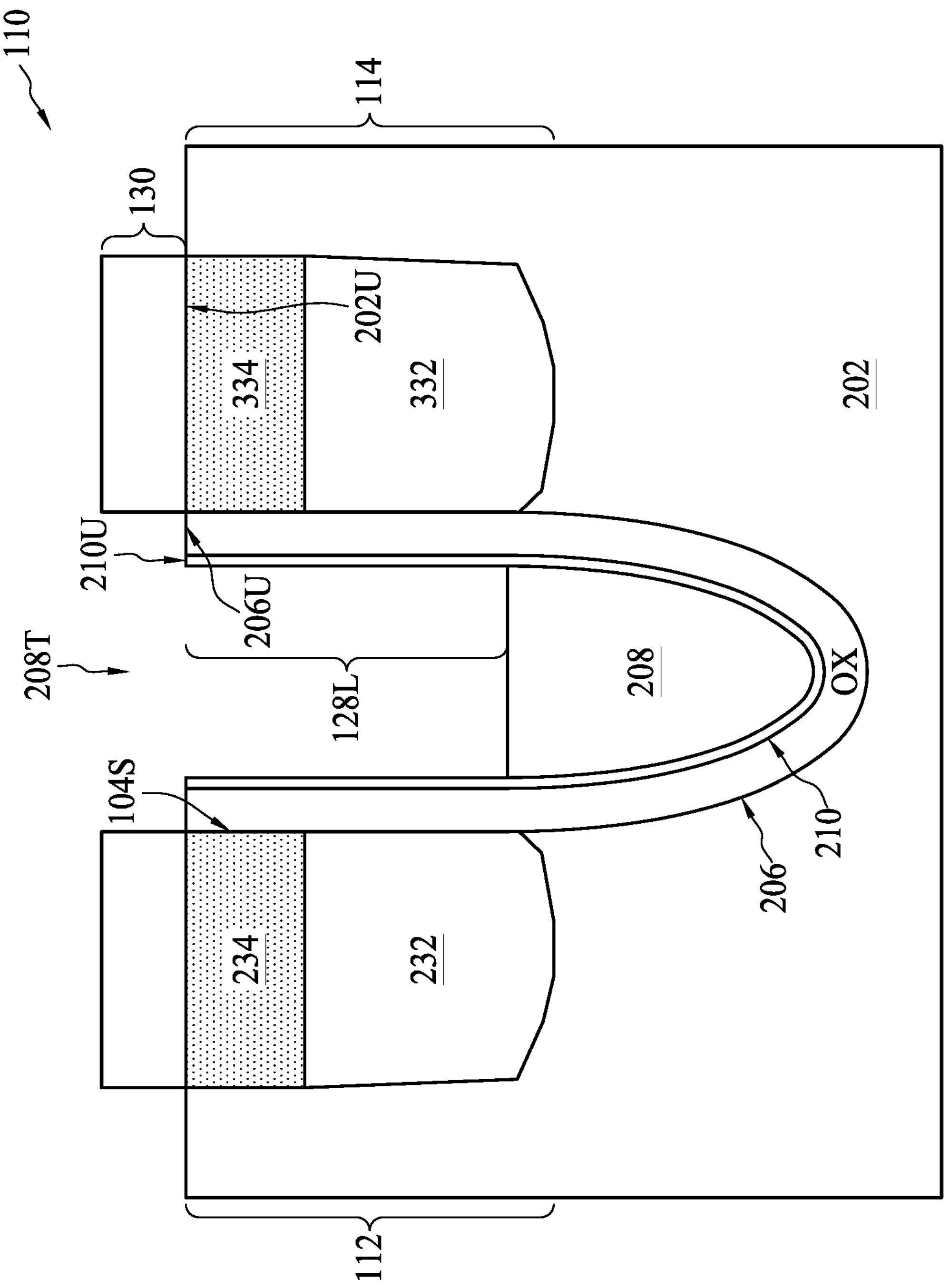
Figure 3H:
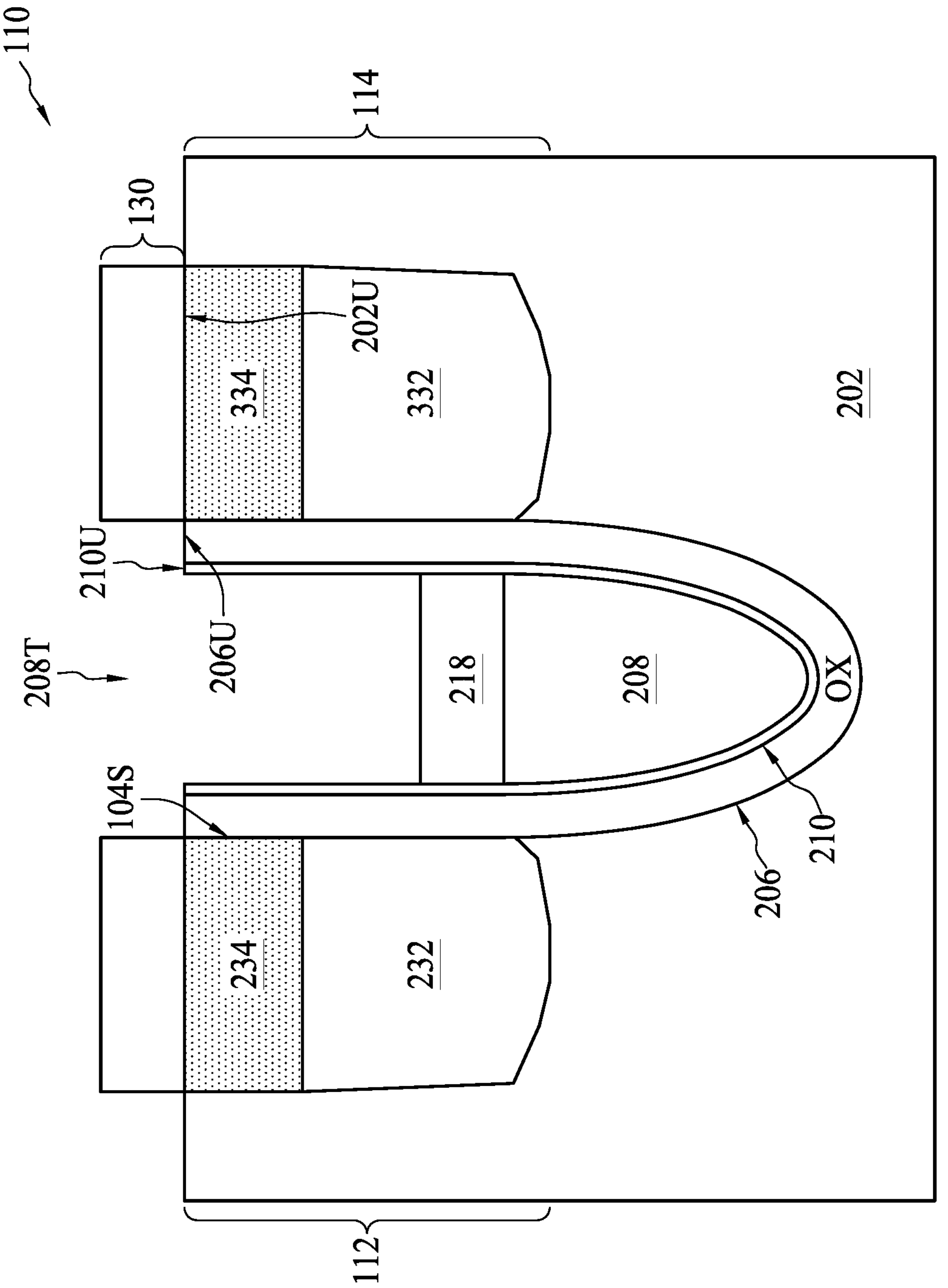
Figure 3I:
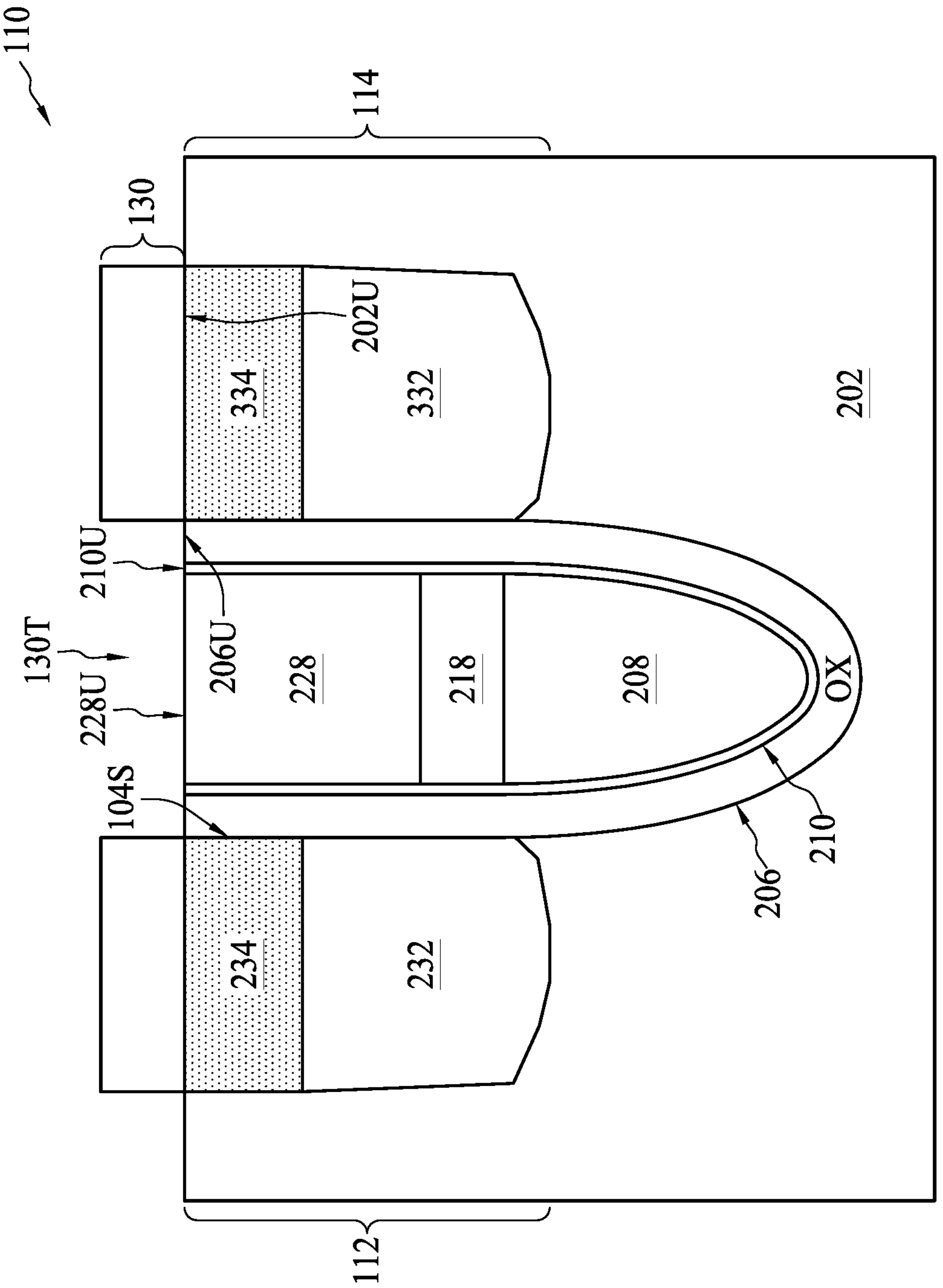
Figure 3J:
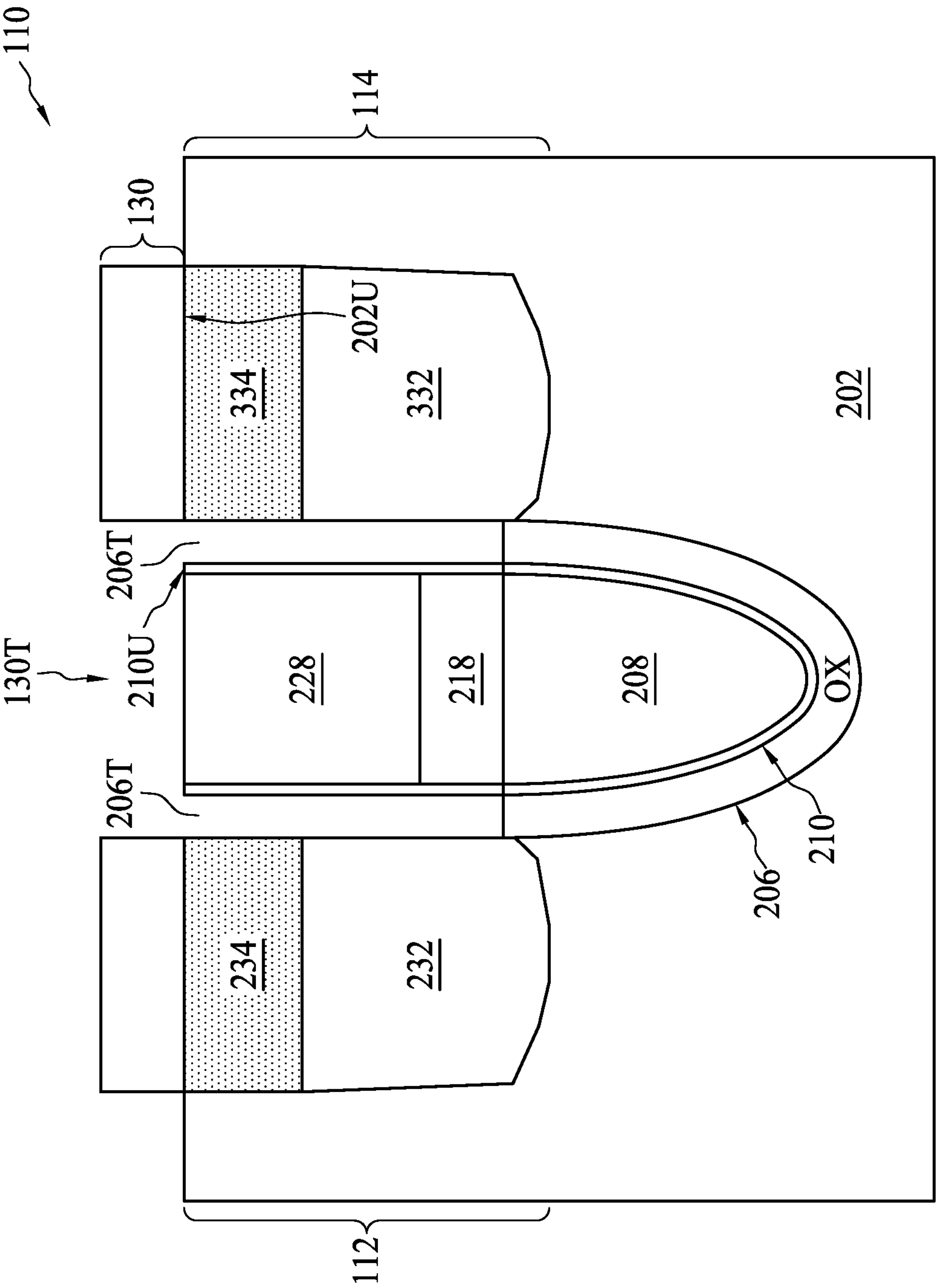
Figure 3K:
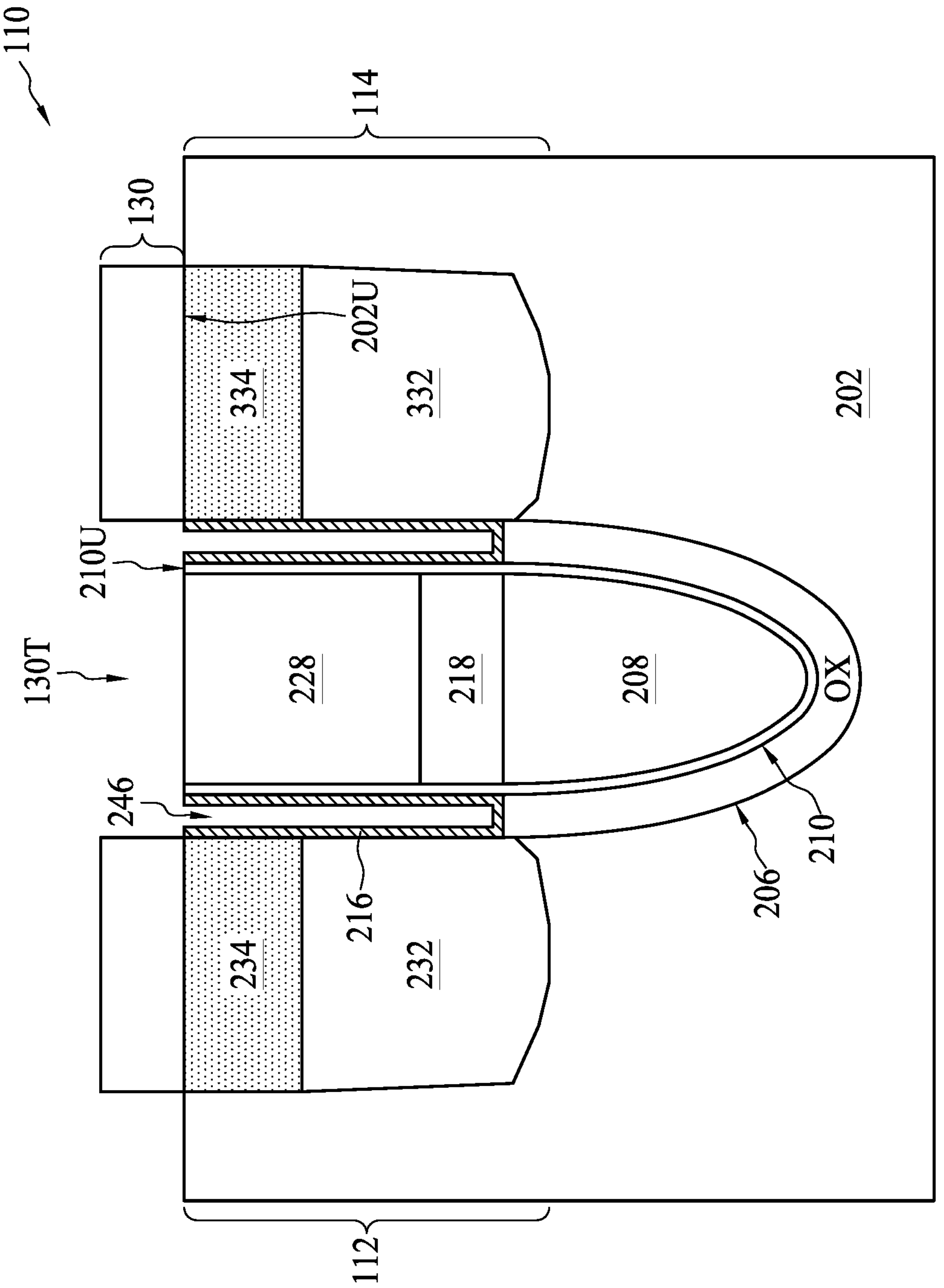
Figure 3L:
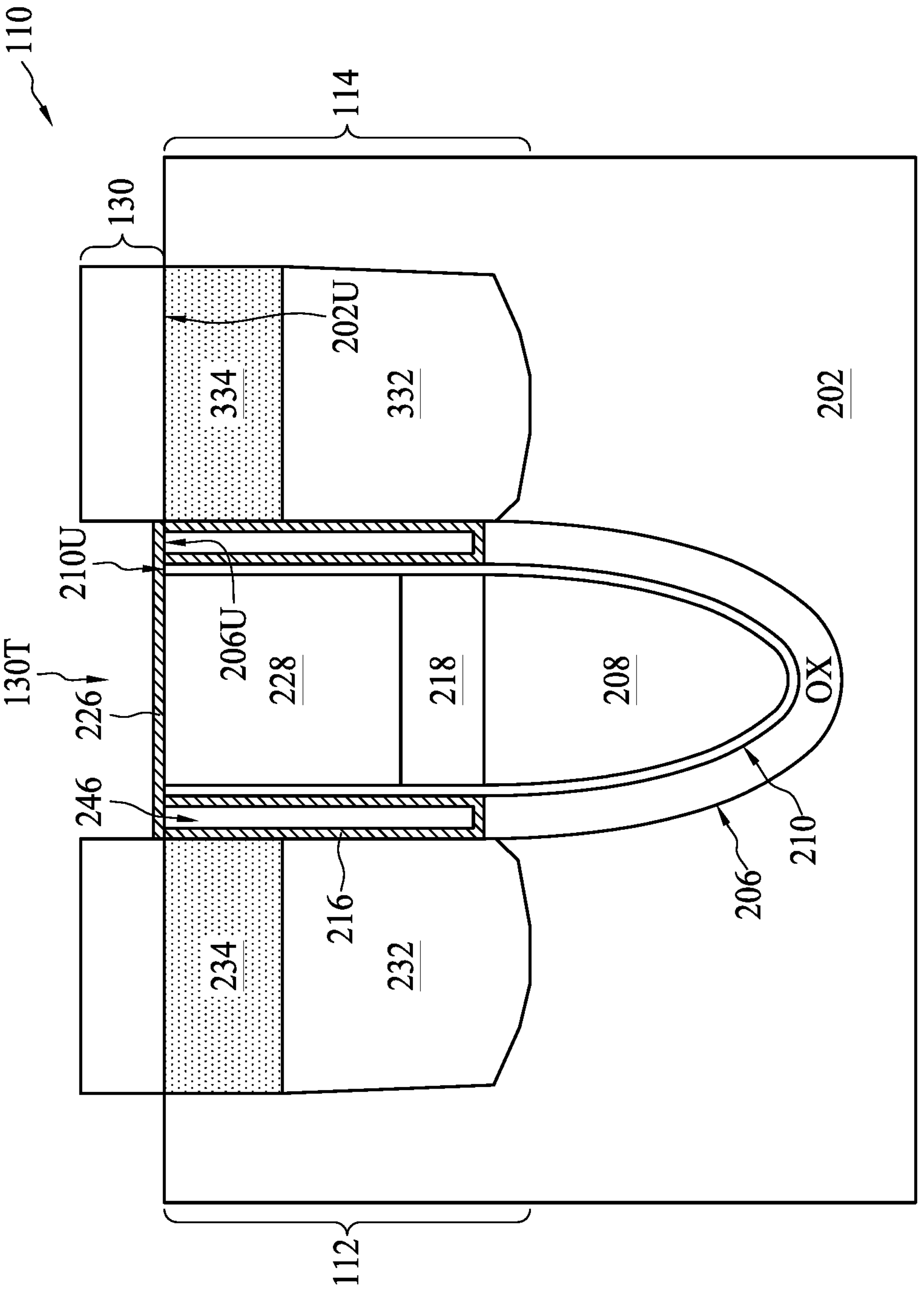
Figure 3M:
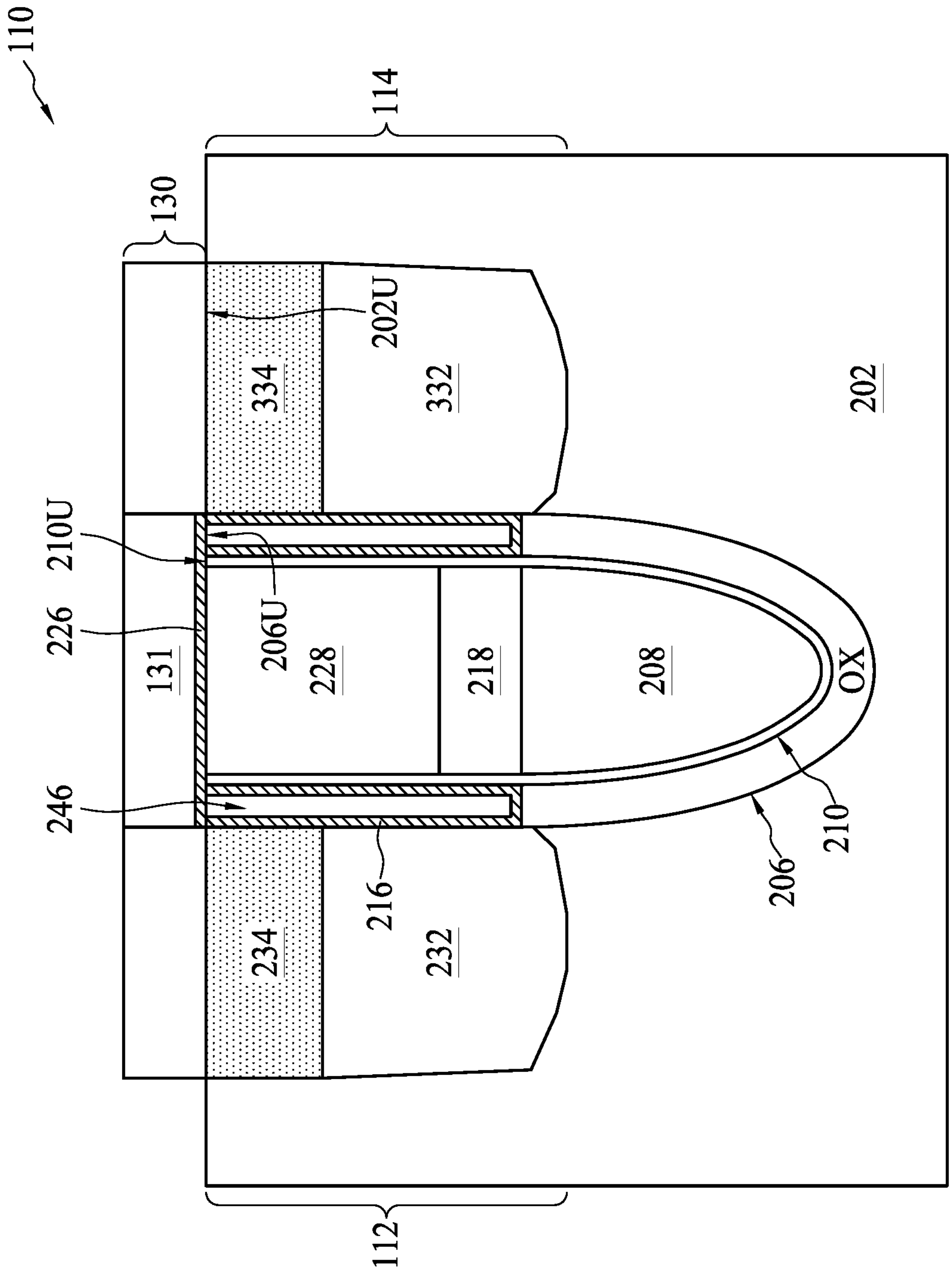
Figure 3N:
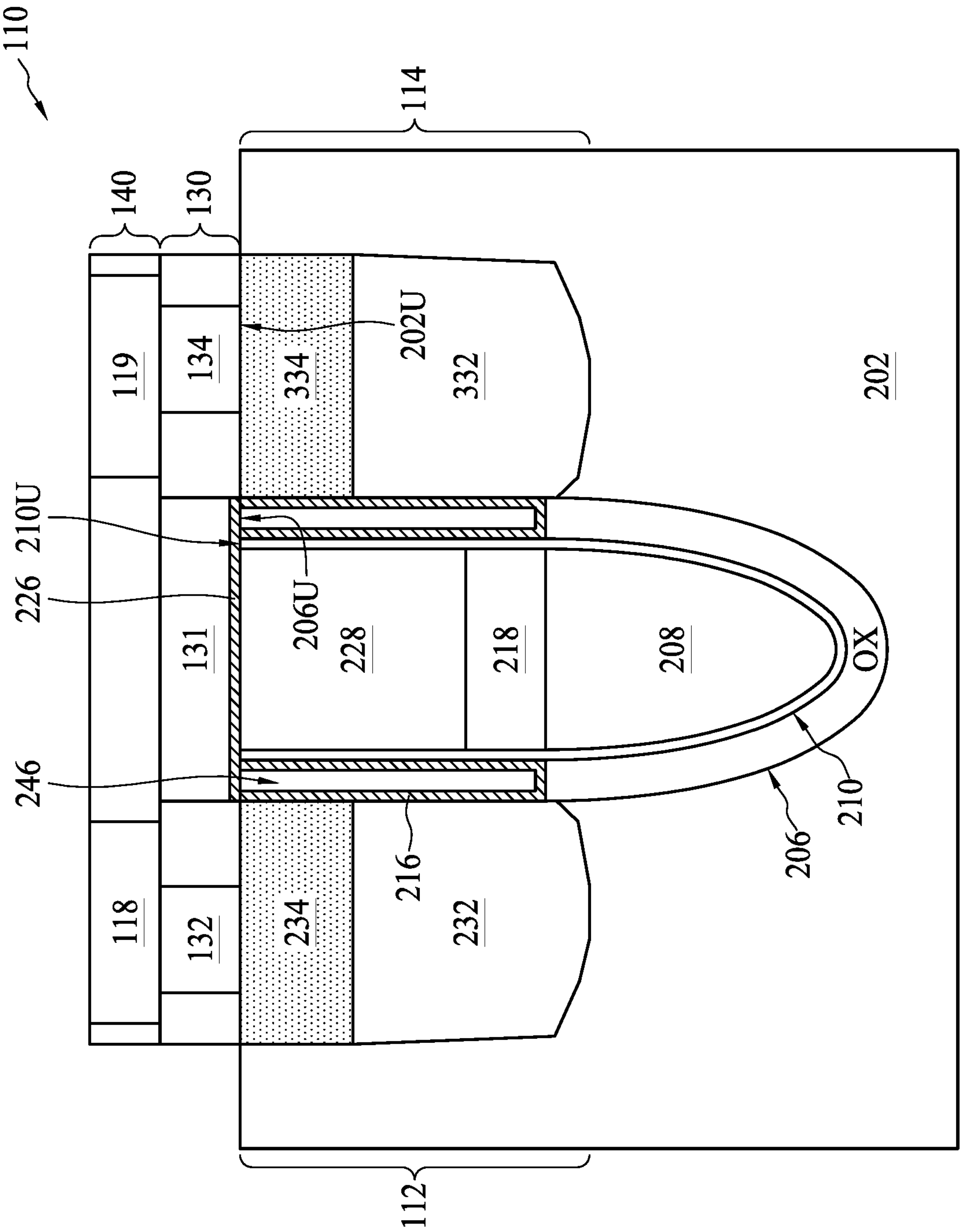

FIGS. 3A to 3N are schematic cross-sectional views of intermediate stages of a method 300 of forming a memory cell 110 shown in FIG. 2, in accordance with some embodiments of the present disclosure. It is understood that additional steps can be provided before, during, and after the steps shown by FIGS. 3A to 3N, and some of the steps described below can be replaced or eliminated for additional embodiments of the method 300. The order of the steps may be interchangeable.

Referring to FIG. 3A, a substrate 202 is provided or received. The substrate 202 may be similar to the substrate 102 shown in FIG. 1B. According to some embodiments of the present disclosure, the substrates 202 includes a semiconductor material such as bulk silicon. According to some embodiments of the present disclosure, the substrate 202 includes other semiconductor materials, such as silicon germanium, silicon carbide, gallium arsenide, or the like.

According to some embodiments of the present disclosure, the substrate 202 is a p-type semiconductive substrate (acceptor type) or an n-type semiconductive substrate (donor type). Alternatively, the substrate 202 includes another elementary semiconductor, such as germanium; a compound semiconductor including gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof.

According to yet another embodiment of the present disclosure, the substrate 202 includes portions to form a semiconductor-on-insulator (SOI) substrate. In other alternatives, the substrate 202 may include a doped epitaxial layer, a gradient semiconductor layer, and/or a semiconductor layer overlaying another semiconductor layer of a different type, such as a silicon layer on a silicon germanium layer. According to some embodiments of the present disclosure, the substrate 202 is a hybrid substrate including first portions formed of a bulk silicon substrate and second portions formed of an SOI substrate.

According to some embodiments of the present disclosure, an isolation region 104 (not separately shown in FIG. 3A) is formed in the substrate 202. The isolation region 104 may be used to define the trenches 104T of the word lines 116 and the active regions 111, including the source/drain regions 112 and 114, of the memory cells 110. According to some embodiments of the present disclosure, the isolation region 104 is formed of a dielectric material, e.g., silicon nitride, silicon oxide, silicon oxynitride, or other suitable dielectric materials.

In an example process for forming the isolation region 104, an etching operation is performed to etch trenches on the substrate 202. The etching operation may be an anisotropic etching, and may include a dry etch, a wet etch, a combination thereof, such as reactive ion etch (RIE), or the like. Subsequently, a dielectric material is deposited in the trenches until the trenches are filled. According to some embodiments of the present disclosure, a planarization operation, e.g., mechanical grinding or chemical mechanical polishing (CMP) is utilized to remove excess materials of the isolation region 104 and level the upper surface of the isolation regions 104 with the upper surface 202U of the substrate 202.

Referring to FIG. 3A, a mask layer 130 is formed over the substrate 202. According to some embodiments of the present disclosure, the mask layer 130 is a dielectric layer and may be similar to the first dielectric layer 130 shown in FIG. 2. According to some embodiments of the present disclosure, the mask layer 130 is formed of silicon nitride, silicon oxide, silicon oxynitride, silicon carbide, or other suitable dielectric materials. According to some embodiments of the present disclosure, the mask layer 130 is deposited over the substrate 202 using CVD, PVD, ALD, spin-on coating, or the like. According to some embodiments of the present disclosure, the mask layer 130 is patterned to include trenches 104T exposing an area for the subsequently formed word lines 116. The mask layer 130 is patterned using photolithography and etching operations. According to some embodiments of the present disclosure, the etching operation include a dry etch, a wet etch, an RIE, or the like. According to some embodiments of the present disclosure, the etching operation include an anisotropic etching operation.

According to some embodiments of the present disclosure, an etching operation is performed on the substrate 202 with the mask layer serving as the etching mask. Referring to FIG. 1A, since the trench 104T is etched where the word line 116 is formed therein, the trench 104T includes a line shape extending across multiple adjacent active regions 111 from a top-view perspective. According to some embodiments of the present disclosure, the etching operation includes a dry etch, a wet etch, an RIE, or the like. According to some embodiments of the present disclosure, the etching operation include an anisotropic etching operation.

Referring to FIG. 3B, doped regions 112 and 114 are formed in the substrate 202 on two sides of the trench 104T. According to some embodiments of the present disclosure, the doped regions 112 and 114 includes a dopant type, e.g., N-type, different from that of the substrate 202. According to some embodiments of the present disclosure, the doped regions 112 and 114 serve as the source/drain regions of the transistor (control unit) of the respective memory cells 110. According to some embodiments of the present disclosure, the doped regions 112 and 114 are formed using one or more ion implantation operations.

According to an example process for forming the doped regions 112 and 114, a mask layer (not separately shown) is deposited over the substrate 202. The mask layer may be formed of a photoresist layer or a dielectric layer, e.g., a hard mask layer. The mask layer is patterned using photolithography and etching operations. According to some embodiments of the present disclosure, the etching operation include a dry etch, a wet etch, an RIE, or the like. The patterned mask layer defines the locations and areas of the doped regions 112 and 114. An ion implantation operation is performed to introduce dopants into the substrate 202 at a predetermined depth with a predetermined dopant concentration. According to some embodiments of the present disclosure, an annealing operation is performed after the ion implantation operations to activate the implanted dopants, to spread the dopants into a predetermined doped region profile, and to remove or fix implantation-induced lattice defects in the substrate 202. According to some embodiments of the present disclosure, the mask layer is removed by stripping or etching after the ion implantation operations are completed.

According to some embodiments of the present disclosure, a lightly-doped-drain (LDD) region 232 or 332 of the doped region 112 or 114, respectively, is formed in a predetermine depth of the substrate 202. For example, the LDD regions 232 and 332 include a doping concentration in a range between about 1E12 and about 1E13 atoms/cm$^3$. According to some embodiments of the present disclosure, the LDD region 232 has a bottom deeper than or substantially equal to a bottom of the LDD region 332. According to some embodiments of the present disclosure, the upper limit of the LDD regions 232 and 332 may be lower than the upper surface 202U through control of the power and dosage of the ion implantation operation.

Referring to FIG. 3C, heavily doped regions 234 and 334 are formed subsequently in the substrate 202 around the upper surface 202U of the substrate 202. According to some embodiments of the present disclosure, the heavily-doped region 234 or 334 has a doping concentration in a range about 1E14 and about 1E15 atoms/cm$^3$. According to some embodiments of the present disclosure, the heavily-doped regions 234 and 334 are used as contacts for the subsequently formed conductive vias and arranged to reduce contact resistance of the source/drain regions 112, 114.

According to some embodiments of the present disclosure, the trench 104T has a depth greater than the depths of the source/drain regions 112 or 114 to prevent the short channel effect. According to some embodiments of the present disclosure, a sidewall 104S of the trench 104T is exposed through the etching operation, in which the sidewall 104S is equivalent to sidewalls of the source/drain region 112 or 114, e.g., sidewalls of the doped regions 232, 234, 332 and 334.

Referring to FIG. 1A and FIG. 3C, according to some embodiments of the present disclosure, the source/drain regions 112 and 114 may be doped to be closer to each other when the ion implantation operations are completed. According to some embodiments of the present disclosure, as shown in FIG. 1A, the source/drain regions 112 and 114 collectively form the active region with an oval or ellipse shape from a top-view perspective, as defined by the isolation regions 104. According to some embodiments of the present disclosure, the trench 104T is etched after the source/drain regions 112, 114 are formed, in which the source/drain regions 112 and 114 contact each other when the ion implantation operations are completed and will be separated by the subsequently-formed word lines 116.

Referring to FIG. 3D, a first dielectric layer 206 of the gate dielectric layer 128 is formed in the trench 104T and deposited on the sidewall 104S of the trench 104T. According to some embodiments of the present disclosure, the first dielectric layer 206 is deposited on the sidewall 104S of the trench 104T in a conformal manner with a substantially uniform thickness. According to some embodiments of the present disclosure, the first dielectric layer 206 includes silicon oxide and is formed using CVD, PVD, ALD, thermal oxidation, or the like. According to some embodiments of the present disclosure, a portion (not shown) of the first dielectric layer 206 is formed on the upper surface of the mask layer 130. According to some embodiments of the present disclosure, an etching operation is performed to remove the portion of the first dielectric layer 206 from a location over the mask layer 130. According to some embodiments of the present disclosure, a portion of the first dielectric layer 206 on the sidewalls of the mask layer 130 is retained. According to some embodiments of the present disclosure, the first dielectric layer 206 is lined to the sidewalls of the doped regions 232, 234, 332 and 334.

Referring to FIG. 3E, the barrier layer 210 is deposited in the trench 104T and over the first dielectric layer 206. According to some embodiments of the present disclosure, the barrier layer 210 includes titanium nitride, tantalum nitride, or the like. According to some embodiments of the present disclosure, the barrier layer 210 is deposited on the sidewalls of the first dielectric layer 206 in a conformal manner with a substantially uniform thickness. The barrier layer 210 may have a thickness less than the thickness of the first dielectric layer 206. According to some embodiments of the present disclosure, a portion (not shown) of the barrier layer 210 is formed on the upper surface of the mask layer 130. According to some embodiments of the present disclosure, an etching operation is performed to remove the portion of the barrier layer 210 from a location over the mask layer 130. According to some embodiments of the present disclosure, a portion of the barrier layer 210 on the sidewalls of the mask layer 130 is retained.

Referring to FIG. 3F, the first gate electrode 208 is deposited in the trench 104T and over the barrier layer 210. According to some embodiments of the present disclosure, the first gate electrode 208 fills the trench 104T. The first gate electrode 208 may be laterally surrounded by, or surrounded from two sides of, the first dielectric layer 206 or the barrier layer 210. According to some embodiments of the present disclosure, the first gate electrode 208 is formed of tungsten or titanium nitride. Alternatively, the first gate electrode 208 includes one of more metallic layers, e.g., copper, cooper alloy, tin, nickel, nickel alloy, aluminum, gold, silver, titanium, titanium nitride, tantalum, tantalum nitride, and the like. According to some embodiments of the present disclosure, the first gate electrode includes work function adjustment metals, such as TiAl, TiAlN, TiAlC, TaC, TaCN, TaSiN, TaAlC, Mn, Zr, a combination thereof, or the like.

Referring to FIG. 3G, the first gate electrode 208 is recessed to a predetermined height. A trench or recess 208T is formed in place of the trench 104T accordingly. The etched height 128L is measured from the upper surface 202U of the substrate 202 to the upper surface of the first gate electrode 208. The recessing of the first gate electrode 208 may include an etching operation, such as a dry etch, a wet etch, an RIE, or the like. After the recessing, the first gate electrode 208 includes a substantially flat upper surface. According to some embodiments of the present disclosure, the first gate electrode 208 is deposited to the predetermined height without the subsequent etching operation, and therefore the step of recessing the first gate electrode is omitted from the method 300.

Referring to FIG. 3H, the second gate electrode 218 is deposited in the trench 208T and over the second dielectric layer 216. According to some embodiments of the present disclosure, the second gate electrode 218 has a work function different from that of the first gate electrode 208 to generate an electric field different from that generated by the second gate electrode 218 around the word line 116 and the channel of the memory cell 110. Thus, the second gate electrode 218 is formed of a material different from that of the first gate electrode 208. According to some embodiments of the present disclosure, the second gate electrode 218 is formed of doped polysilicon. The second gate electrode 218 may be deposited using CVD, PVD, ALD, or other suitable deposition methods. The dopant of the second gate electrode 218 can be doped using an ion implantation operation. The second gate electrode 218 may be laterally surrounded by, or surrounded from two sides of, the middle portion of the first dielectric layer 206 and the barrier layer 210.

According to some embodiments of the present disclosure, the second gate electrode 218 fills the trench 208T and then is recessed to a predetermined thickness as shown in FIG. 3H. The recessing of the second gate electrode 218 may include an etching operation, such as a dry etch, a wet etch, an RIE, or the like. After the recessing, the second gate electrode 218 includes a substantially flat upper surface. According to some embodiments of the present disclosure, the second gate electrode 218 is deposited to the predetermined height without the subsequent etching operation, and therefore the step of recessing the second gate electrode 218 is omitted from the method 300.

According to some embodiments of the present disclosure, an additional insulating film (not shown) is deposited over the first gate electrode 208 prior to the formation of the second gate electrode 218. The additional insulating film separates the first gate electrode 208 from the second gate electrode 218. According to some embodiments of the present disclosure, the additional insulating film extends between the first gate electrode 208 and the second gate electrode 218, and extend to the sidewalls of the barrier layer 210. The additional insulating film may be formed of a dielectric material, e.g., silicon oxide, silicon nitride, silicon carbide, silicon oxynitride, or the like. The additional insulating film is deposited over the first gate electrode 208 using CVD, PVD, ALD, or the like.

FIG. 3I illustrates the formation of the capping layer 228 in the trench 208T. A trench 130T is thus formed in place of the trench 108T. According to some embodiments of the present disclosure, the capping layer 228 contacts the sidewalls of the barrier layer 210. According to some embodiments of the present disclosure, the capping layer 228 contacts the upper surface of the second gate electrode 218. The capping layer may include an upper surface 228U coplanar with the upper surface 202U of the substrate 202. According to some embodiments of the present disclosure, the capping layer 228 includes a dielectric material, e.g., silicon nitride, different from that of the first dielectric layer 206. According to some embodiments of the present disclosure, the capping layer 228 includes a dielectric material similar to the mask layer 130. According to some embodiments of the present disclosure, the capping layer 228 is formed using CVD, PVD, ALD, or the like. According to some embodiments of the present disclosure, an etching operation is performed to remove the excess material of the capping layer 228 over the substrate 202 and to cause the upper surface 228U of the capping layer 228 to be coplanar with the upper surfaces 206U of the first dielectric layer 206 and the upper surface 210U of the barrier layer 210.

FIG. 3J illustrates an etching operation on the first dielectric layer 106. The etching operation recesses the upper surface of the first dielectric layer 106 to form trenches 206T. The trenches 206T may be in a ring shape from a top-view perspective and laterally surround the barrier layer 210, the capping layer 228 and the second gate electrode 218. The trenches 206T further exposes lower portions of the first dielectric layer 106.

According to some embodiments of the present disclosure, the bottom of the trench 206T is substantially coplanar with the upper surface of the second gate electrode 218. According to some other embodiments of the present disclosure, the bottom of the trench 206T is lower than the bottom surface of the second gate electrode 218. According to some embodiments, an upper portion of the first dielectric layer 106 is consumed by the etching operation such that only a bottom portion of the first dielectric layer 106 remains during the etching operation. The entire first dielectric layer 106 may be removed by one or more etching operations involving a combination of a dry etch, a wet etch, an RIE, and the like. According to some embodiments of the present disclosure, the etching operation is performed with the mask layer 130, the capping layer 228, and the barrier layer 210 serving as the etching mask. According to some embodiments of the present disclosure, the etching operation is an anisotropic etching operation, e.g., a dry etch.

According to some embodiments of the present disclosure, the etching operation shown in FIG. 3J is performed with the vacuum broken. A fluid, such as air or other suitable gas, is allowed to fill the trenches 206T and form an air gap in the low-k layer 246.

Referring to FIG. 3K, the second dielectric layer 216 is deposited on the sidewalls and the bottom of the trenches 206T. The second dielectric layer 216 may be deposited to the sidewalls and the bottom of the trenches 206T in a conformal manner. The thickness of the second dielectric layer 216 is up to less than about 10 nanometers. Referring to FIGS. 2 and 3K, the second dielectric layer 216 shown in FIG. 2 corresponds to the outer ring portion and the bottom portion of the second dielectric layer 216 shown in FIG. 3K, while the fourth dielectric layer 236 shown in FIG. 2 corresponds to the inner ring portion of the second dielectric layer 216 shown in FIG. 3K. The second dielectric layer 216 shown in FIG. 3K may include a dielectric material different from the first dielectric layer 206, e.g., the first dielectric layer 206 and the second dielectric layer are formed of silicon oxide and silicon nitride, respectively. According to some embodiments of the present disclosure, the second dielectric layer 216 is formed using ALD to ensure desirable conformal deposition of the second dielectric layer 216 in the narrow trenches 206T with a sufficient space (e.g., the space 216P shown in FIG. 2) of the low-k layer 246 left in the second dielectric layer 216.

According to some embodiments of the present disclosure, a patterned mask layer (not separately shown) is formed over the substrate 202 to expose the trenches 206T while covering other features of the memory cell 110. The dielectric material of the second dielectric layer 216 is deposited to the sidewalls and the bottom of the trenches 206T. The patterned mask layer may be stripped or etched away after the deposition of the second dielectric layer 216 is completed.

Referring to FIG. 3L, the third dielectric layer 226 is deposited over the upper portion of the low-k layer 246 and the upper surface of the capping layer 228. The third dielectric layer 226 seals the opening of the low-k layer 246 during the formation of the third dielectric layer 226. As a result, the low-k layer 246 is formed and surrounded by the second dielectric layer 216 and the third dielectric layer 226. According to some embodiments of the present disclosure, the third dielectric layer 226 includes a dielectric material similar to the second dielectric layer 216, e.g., silicon nitride. The third dielectric layer 226 may be formed using CVD or other suitable deposition methods for facilitating the closing of the opening of the low-k layer 246. For example, the deposition of the third dielectric layer 226 forms overhang portions over the opening of the low-k layer 246 from sidewalls of the second dielectric layer 216. The overhang portions may continue to grow from the second dielectric layer 216 to reduce the opening of the low-k layer until the overhang portions merge to close the opening of the low-k layer 246.

According to some embodiments of the present disclosure, a low-k dielectric material, e.g., silicon-carbon oxide, is deposited in the trenches 206T to form a solid low-k layer 426 instead of the air gap. The low-k dielectric material may have a dielectric constant lower than that of the silicon nitride, silicon oxide, or the like. The low-k dielectric material is deposited using CVD, PVD, ALD, or other suitable deposition methods.

As discussed above, the deposition properties of the second dielectric layer 216 and the third dielectric layer 226 are different. The second dielectric layer 216 has a better thickness uniformity than the third dielectric layer 226, while the third dielectric layer 226 has greater viscosity than the second dielectric layer 216 during the formation process to facilitate the closing of the gap opening. Therefore, the third dielectric layer 226 may not have uniform thickness across the locations directly over the low-k layer 246 and directly over the second dielectric layer 216 or the capping layer 228. According to some embodiments of the present disclosure, a portion of the third dielectric layer 226 extends into the interior of the low-k layer 246 during the closing of the low-k layer 246. As a result, the thickness of the third dielectric layer 236 over the low-k layer 246 may be greater than the thickness of the third dielectric layer 236 over the second dielectric layer 216, the barrier layer 210 or the capping layer 228.

As discussed previously, the composite gate dielectric layer is constructed by the first dielectric layer 106, the second dielectric layer 216 and the low-k layer 246. Since the low-k layer 246 formed of an air gap, which has a lowest dielectric constant among the available dielectric materials, replaces a majority of a solid version of the second dielectric layer 216, the effective dielectric constant of the gate dielectric layer 128 can be greatly reduced. The resulting electrical field associated with the high dielectric constant of the existing memory cell can be lowered by a great amount. The leakage current incurred due to the high electrical field can be mitigated accordingly.

Referring to FIG. 3M, a dielectric region 131 is formed in the trench 130T. The dielectric region 131 may include a dielectric material similar to the mask layer 130, e.g., silicon nitride, silicon oxide, silicon carbide, silicon oxynitride, or the like. The dielectric region 131 may be deposited in the trench 130T by CVD, PVD, ALD, or other suitable deposition methods. According to some embodiments of the present disclosure, a planarization operation, e.g., CMP, is performed over the mask layer 130 and the dielectric region 131 after the deposition of the dielectric region 131 to remove the excess material of the dielectric region 131 and to level the upper surface of the dielectric region 131 with the upper surface of the mask layer 130.

Referring to FIG. 3N, conductive vias 132 and 134 are formed in the mask layer 130. Furthermore, the second dielectric layer 140 is deposited over the mask layer 130. Conductive lines 118 and 119 are formed in the second dielectric layer 140. According to some embodiments of the present disclosure, the conductive via 132 is formed through the mask layer 130 to electrically couple the source/drain region 112 to the conductive line 118. Similarly, the conductive via 134 is formed through the mask layer 130 to electrically couple the source/drain region 114 to the conductive line 119. The second dielectric layer 140 may be formed with a material similar to the mask layer 130 using CVD, PVD, ALD, spin-on coating, or the like. The conductive vias 132, 134 and the conductive lines 118, 119 may be formed of a conductive material, e.g., copper, aluminum, tungsten, titanium, titanium nitride, tantalum, tantalum nitride, or the like. The conductive vias 132, 134 and the conductive lines 118, 119 may be formed using CVD, PVD, ALD, plating, or other suitable deposition operations.

FIGS. 4A to 4K are schematic cross-sectional views of intermediate stages of a method 400 of forming a memory cell 101 in accordance with some embodiments of the present disclosure. The method 400 is similar to the method 300 for forming the memory cells in many aspects, and these similar descriptions are omitted herein for brevity.

Figure 4A:
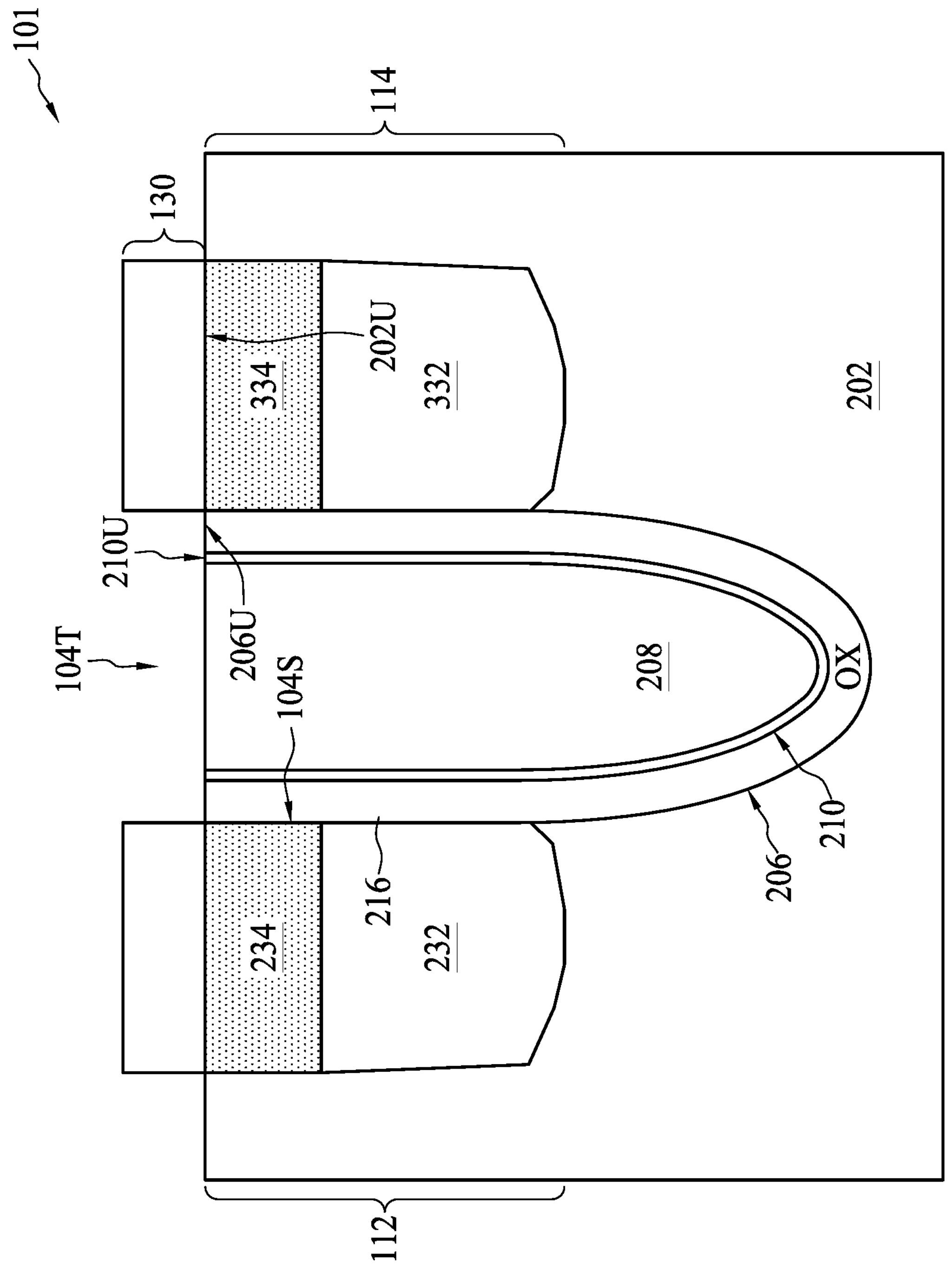
FIGS. 4A to 4K are schematic cross-sectional views of intermediate stages of a method of forming a memory cell, in accordance with some comparative embodiments of the present disclosure.

Referring to FIG. 4A, the memory cell 101 is formed with a procedure similar to that of the memory cell 110 with reference to FIG. 3F, wherein the first dielectric layer 206, the barrier layer 210 and the first gate electrode 208 are deposited in the trench 104T. The upper surfaces of the first dielectric layer 206, the barrier layer 210 and the first gate electrode 208 may be coplanar with the upper surface 202U of the substrate 202.

Figure 4B:
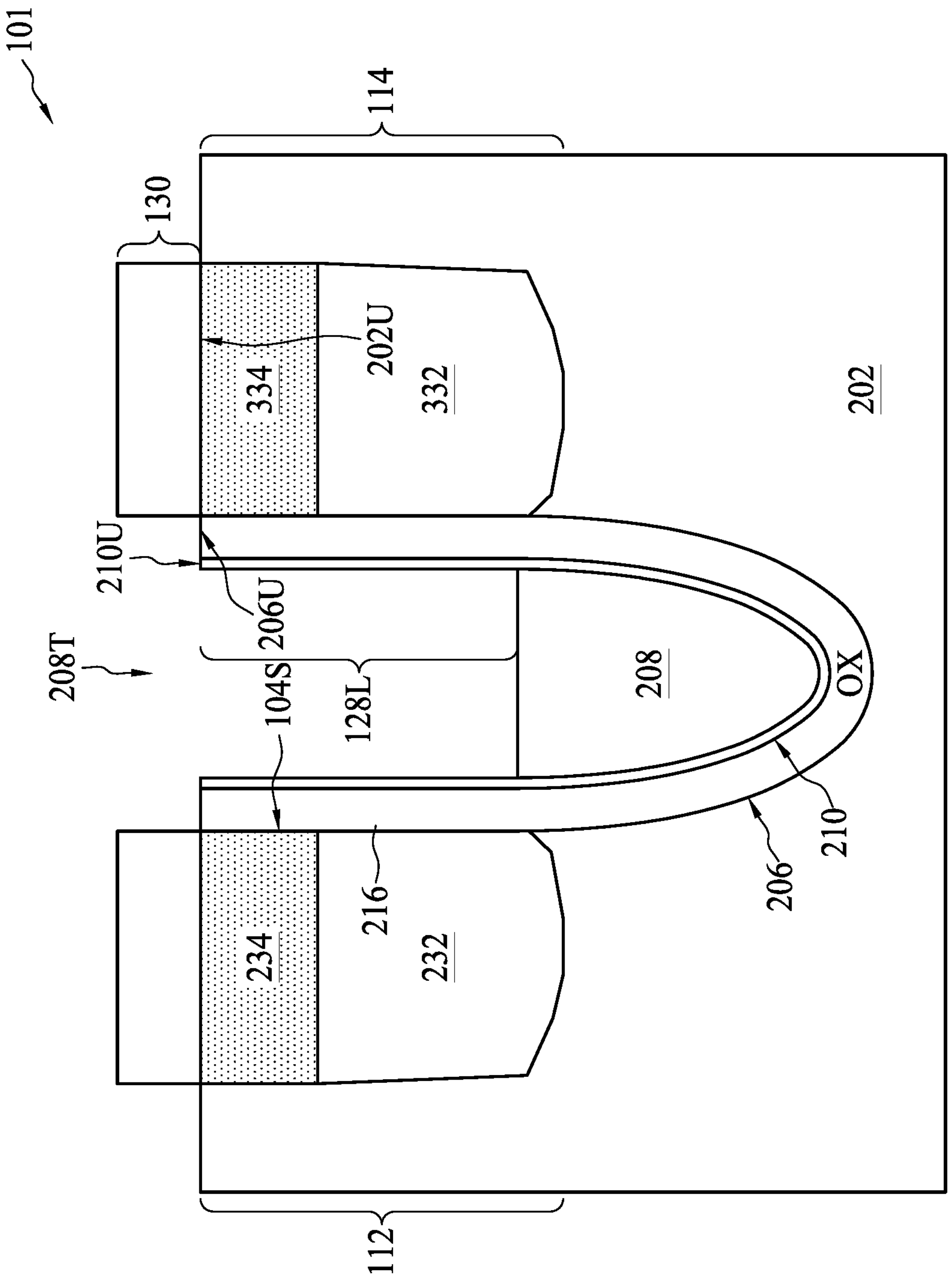

Referring to FIG. 4B, the first gate electrode 208 is recessed to a predetermined thickness in a manner similar to the process shown with reference to FIG. 3G. A trench 208T is formed after the recessing operation is performed, in which the height 128L of the trench 208T is measured from the upper surface of the first gate electrode 208 to the upper surface 202U. According to some embodiments of the present disclosure, the recessing operation is performed using an etching operation, e.g., a dry etch, a wet etch, an RIE, or the like.

Figure 4C:
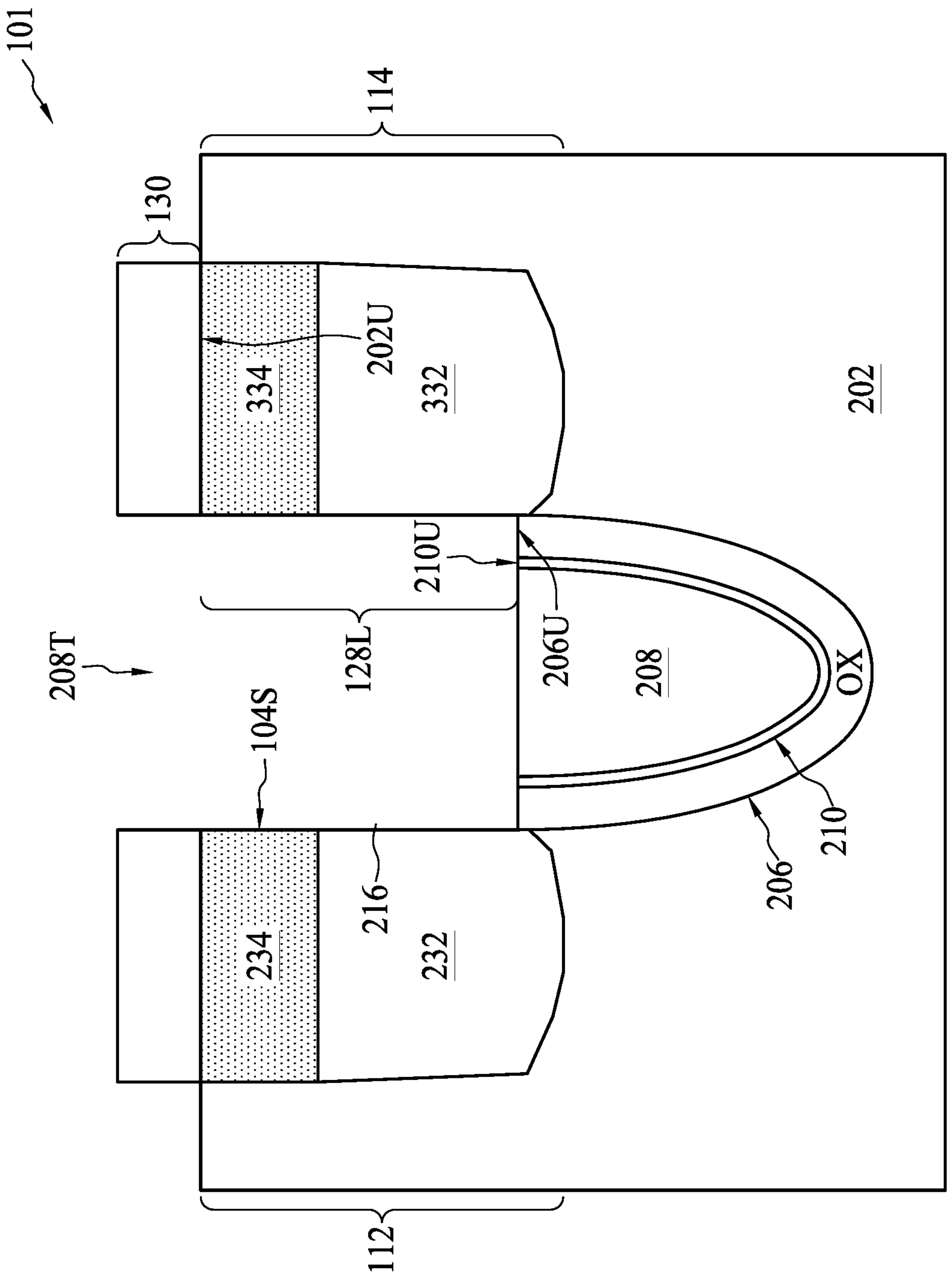

Referring to FIG. 4C, the barrier layer 210 and the first dielectric layer 206 is recessed to the height of the trench 208T. The sidewalls 104S of the trench 104T, which are also the sidewalls of the source/drain regions 112, 114 are thus exposed through the recessing operation. According to some embodiments of the present disclosure, the recessing operation of the barrier layer 210 and the first dielectric layer 206 is performed using an etching operation, e.g., a dry etch, a wet etch, an RIE, or the like. According to some embodiments of the present disclosure, the order of recessing operations of the first gate electrode 208, the barrier layer 210 and the first dielectric layer 206 is exchangeable, or the recessing operations of the first gate electrode 208, the barrier layer 210 and the first dielectric layer 206 are performed during a single etching operation. According to some embodiments of the present disclosure, the upper surfaces of the first gate electrode 208, the barrier layer 210 and the first dielectric layer are substantially coplanar.

Figure 4D:
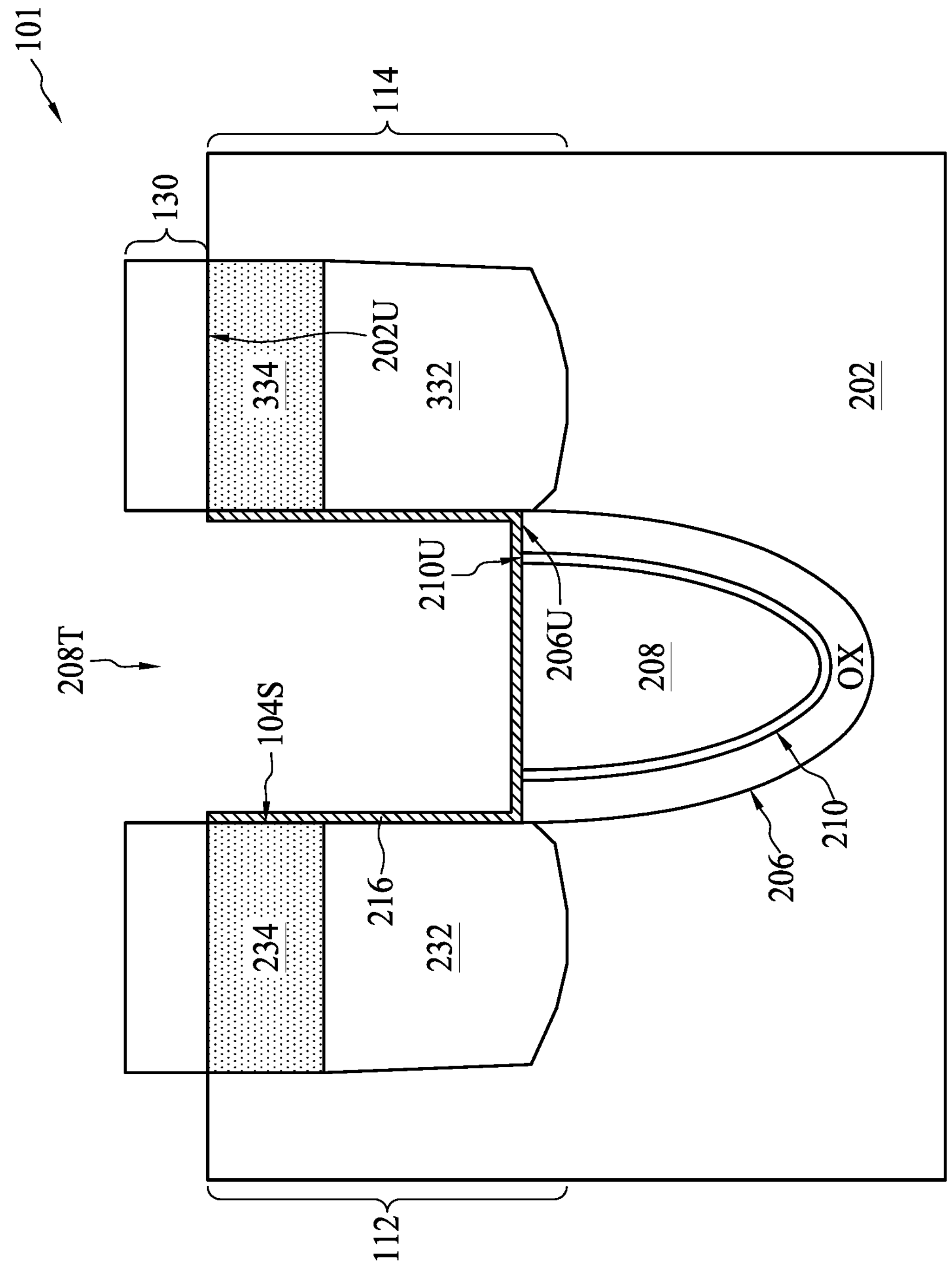

Referring to FIG. 4D, the second dielectric layer 216 is deposited on the sidewalls and the bottom of the trench 208T. The second dielectric layer 216 extends over the upper surfaces of the first gate electrode 208, the barrier layer 210 and the first dielectric layer 206. The second dielectric layer 216 may include a dielectric material, e.g., silicon nitride, different from the first dielectric layer 206. According to some embodiments of the present disclosure, the second dielectric layer 216 is formed in a conformal manner on the sidewalls of the trench 208T (or equivalently the sidewalls of the source/drain regions 112, 114) using a suitable deposition method, e.g., ALD. The second dielectric layer 216 may have uniform thicknesses across the entire length of the second dielectric layer 216.

According to some embodiments of the present disclosure, the material of the second dielectric layer 216 is deposited on the sidewalls and the bottom of the trench 208T and over the surface of the mask layer 130. A patterning operation is performed to remove the excess material of the second dielectric layer 216 over the mask layer so that a portion of the material of the second dielectric layer 216 on the sidewalls of the source/drain regions 112, 114 and the bottom of the trench 208T is left to thereby form the second dielectric layer 216.

Figure 4E:
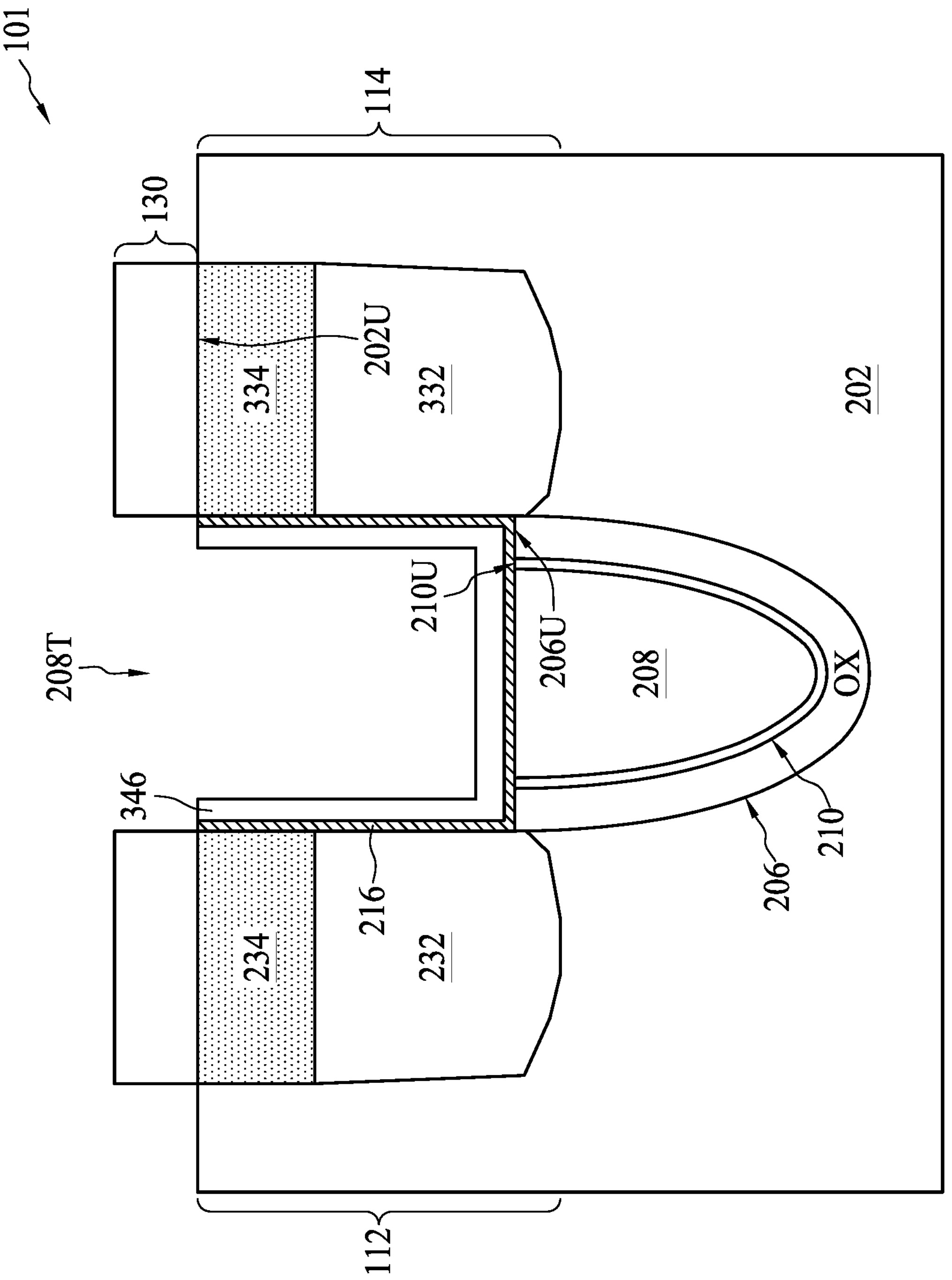

Referring to FIG. 4E, a sacrificial layer 346 is deposited over the second dielectric layer 216 in the trench 208T. The sacrificial layer may include a dielectric material, e.g., silicon oxide or silicon-carbon oxide, different from the second dielectric layer 216. According to some embodiments of the present disclosure, the sacrificial layer 346 is formed in a conformal manner on the sidewalls of the second dielectric layer 216 using a suitable deposition method, e.g., ALD. The sacrificial layer 346 may have uniform thicknesses across the entire length of the sacrificial layer 346.

According to some embodiments of the present disclosure, the sacrificial layer 346 includes a low-k material, e.g., silicon-carbon oxide. In that case, the sacrificial layer 346 may not be consumed in forming the low-k layer 346 in a subsequent operation.

According to some embodiments of the present disclosure, the material of the sacrificial layer 346 is deposited over the second dielectric layer 216 and over the surface of the mask layer 130. A patterning operation is performed to remove the material of the sacrificial layer 346 over the surface of the mask layer 130 so that a portion of the material of the sacrificial layer 346 on the second dielectric layer 216 is left to thereby form the sacrificial layer 346.

Figure 4F:
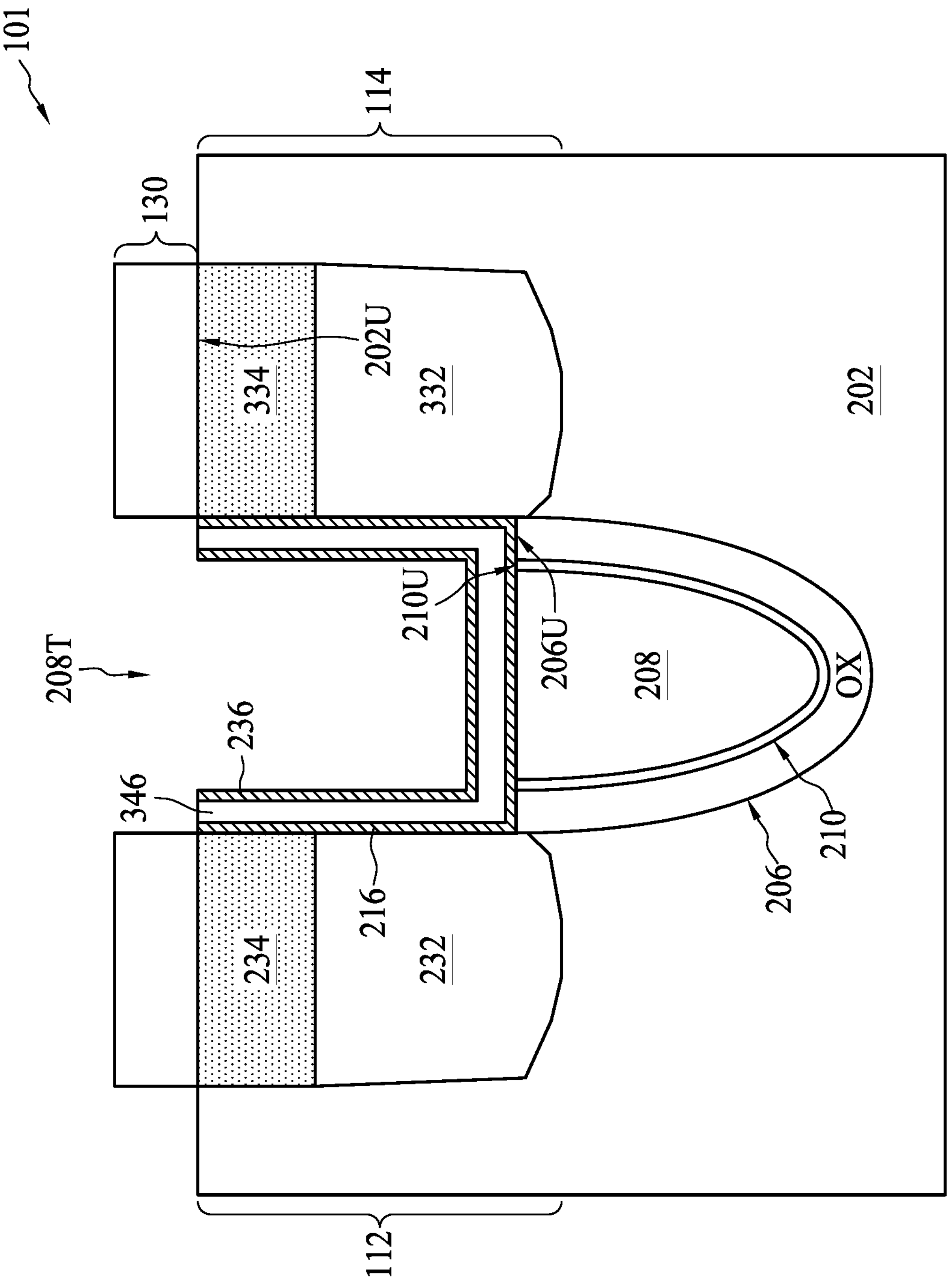

FIG. 4F illustrates the formation of the fourth dielectric layer over the sacrificial layer 346. The fourth dielectric layer 236 may include a dielectric material, e.g., silicon nitride, similar to the second dielectric layer 216. Alternatively, the fourth dielectric layer 236 may include another dielectric material, e.g., silicon-carbon oxide, given that the low-k layer 246 includes air. According to some embodiments of the present disclosure, the fourth dielectric layer 236 is formed in a conformal manner on the sidewalls of the sacrificial layer 346 using a suitable deposition method, e.g., ALD. The fourth dielectric layer may have uniform thicknesses across the entire length of the fourth dielectric layer 236.

According to some embodiments of the present disclosure, the material of the fourth dielectric layer 236 is deposited over the sacrificial layer 346 and over the surface of the mask layer 130. A patterning operation is performed to remove the material of the fourth dielectric layer 236 over the surface of the mask layer 130 so that a portion of the material of the fourth dielectric layer 236 on the sacrificial layer 346 is left to thereby form the fourth dielectric layer 236.

Figure 4G:
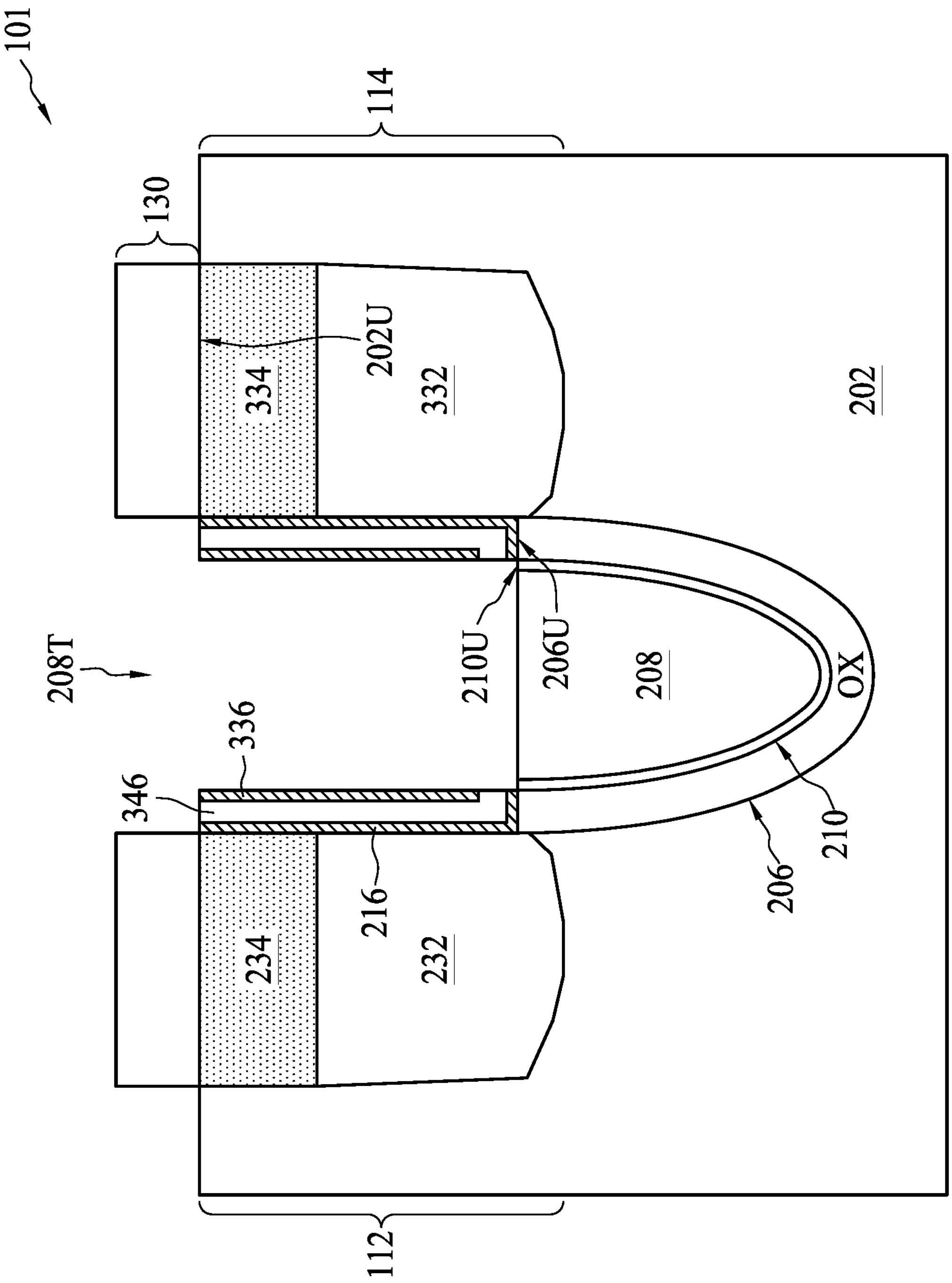

Referring to FIG. 4G, a patterning operation is performed to pattern the second dielectric layer 216, the sacrificial layer 346 and the fourth dielectric layer 236. The patterning operation may include photolithography and etching operations. The etching operation may include a dry etch, a wet etch, an RIE, or the like. In the depicted example, the etching operation is an anisotropic etch. Portions of the second dielectric layer 216, the sacrificial layer 346 and the fourth dielectric layer 236 directly over the first gate electrode 208 are removed, thereby exposing the upper surfaces of the first gate electrode 208 and the barrier layer 210. According to some embodiments of the present disclosure, the first dielectric layer 206 is kept covered by the second dielectric layer 216 during the patterning operation. The horizontal portion of the fourth dielectric layer 236 is removed during the patterning operation. Portions of the sacrificial layer 346 near the first dielectric layer 106 between the second dielectric layer 216 and the fourth dielectric layer 236 are exposed and face the trench 208T.

Figure 4H:
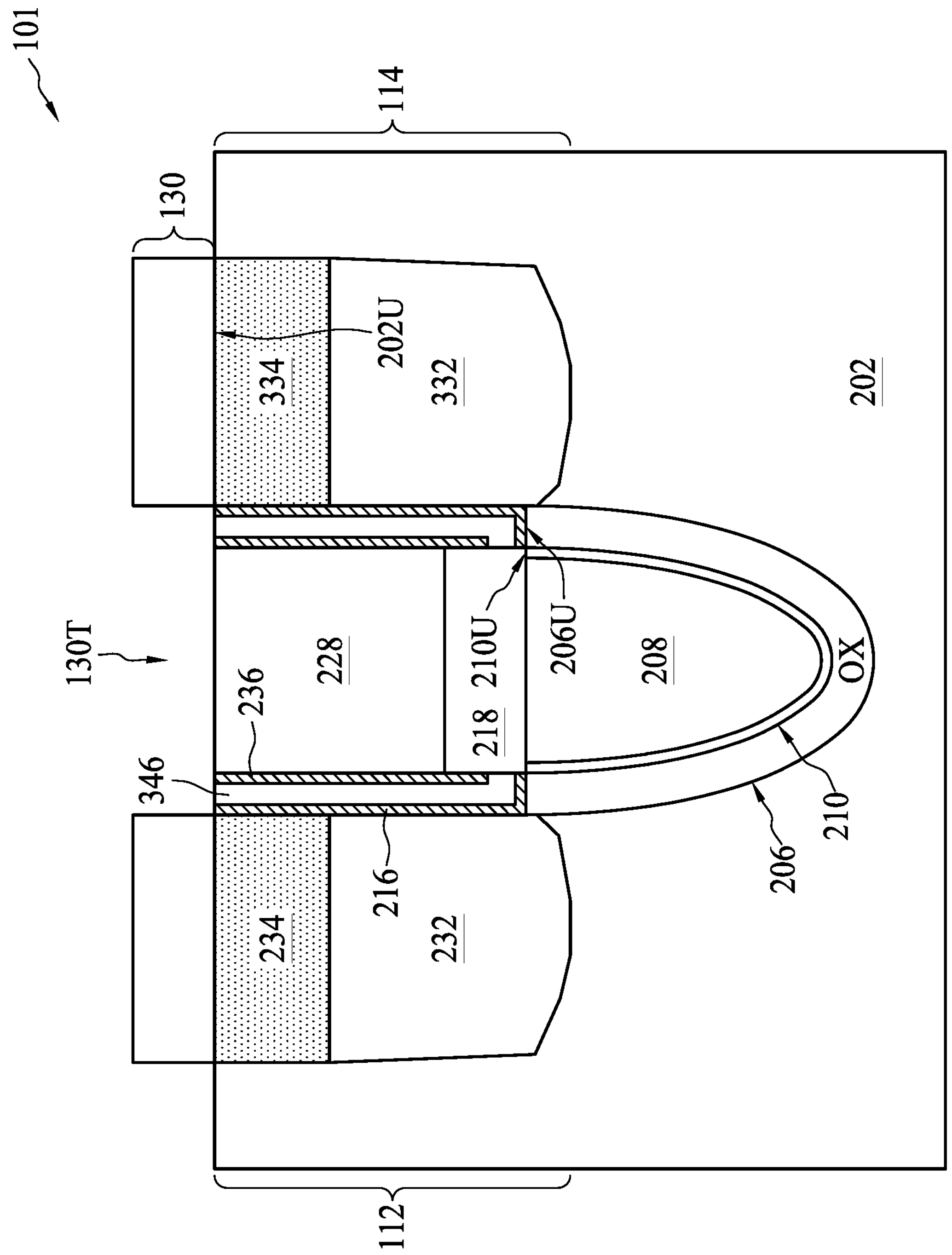

Referring to FIG. 4H, the second gate electrode 218 and the capping layer 228 are deposited in sequence over the first gate electrode 208. The deposition of the second gate electrode 218 and the capping layer 228 is similar to that described with reference to FIGS. 3H and 3I. According to some embodiments of the present disclosure, the second gate electrode 218 contacts or is in fluid communication with the sacrificial layer 346 at a lower portion of the sacrificial layer 346. The second gate electrode 218 may be laterally surrounded by the second dielectric layer 216, the sacrificial layer 346 and the fourth dielectric layer 236.

According to some embodiments of the present disclosure, the patterning operation with reference to FIG. 4G leaves the horizontal portion of the second dielectric layer 216 in place, and therefore the second gat electrode 218 is deposited over the second dielectric layer 216, and is separated from the first gate electrode 208 by the second dielectric layer 216.

Figure 4I:
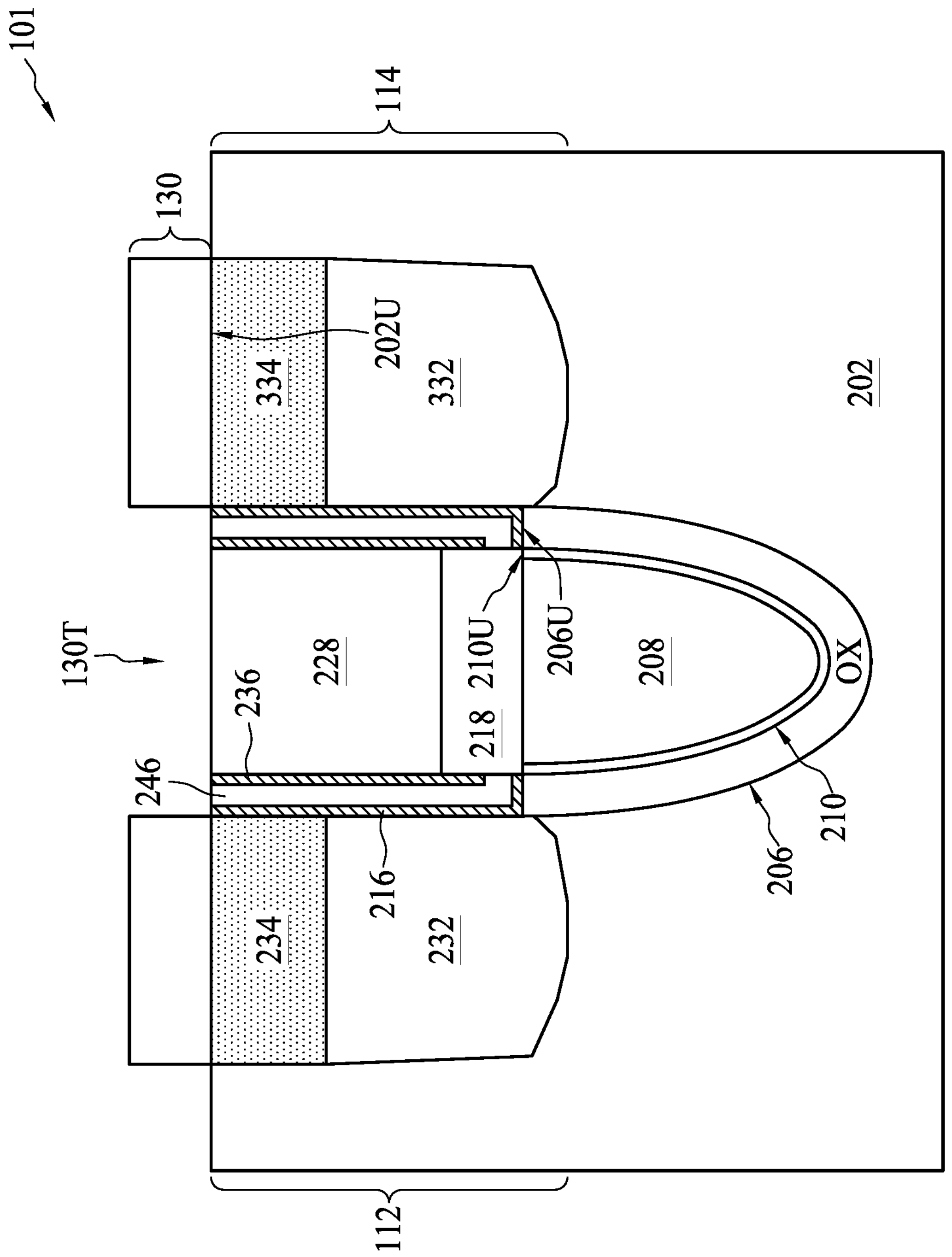

Referring to FIG. 4I, an etching operation is performed to remove the sacrificial layer 346 to thereby form an air gap serving as the low-k layer 246. The etching operation may include a dry etch, a wet etch, an RIE, or the like. In embodiments where the sacrificial layer 346 is formed of silicon-carbon oxide, the sacrificial layer 346 is not etched and surrounded by the second dielectric layer 216 and the fourth dielectric layer 236. The sacrificial layer 346 is used as the low-k layer 246 due to the relatively low dielectric constant of the silicon-carbon oxide. According to some embodiments of the present disclosure, the second gate electrode 218 contacts or is in fluid communication with the low-k layer 246 at a lower portion of the low-k layer 246.

Figure 4J:
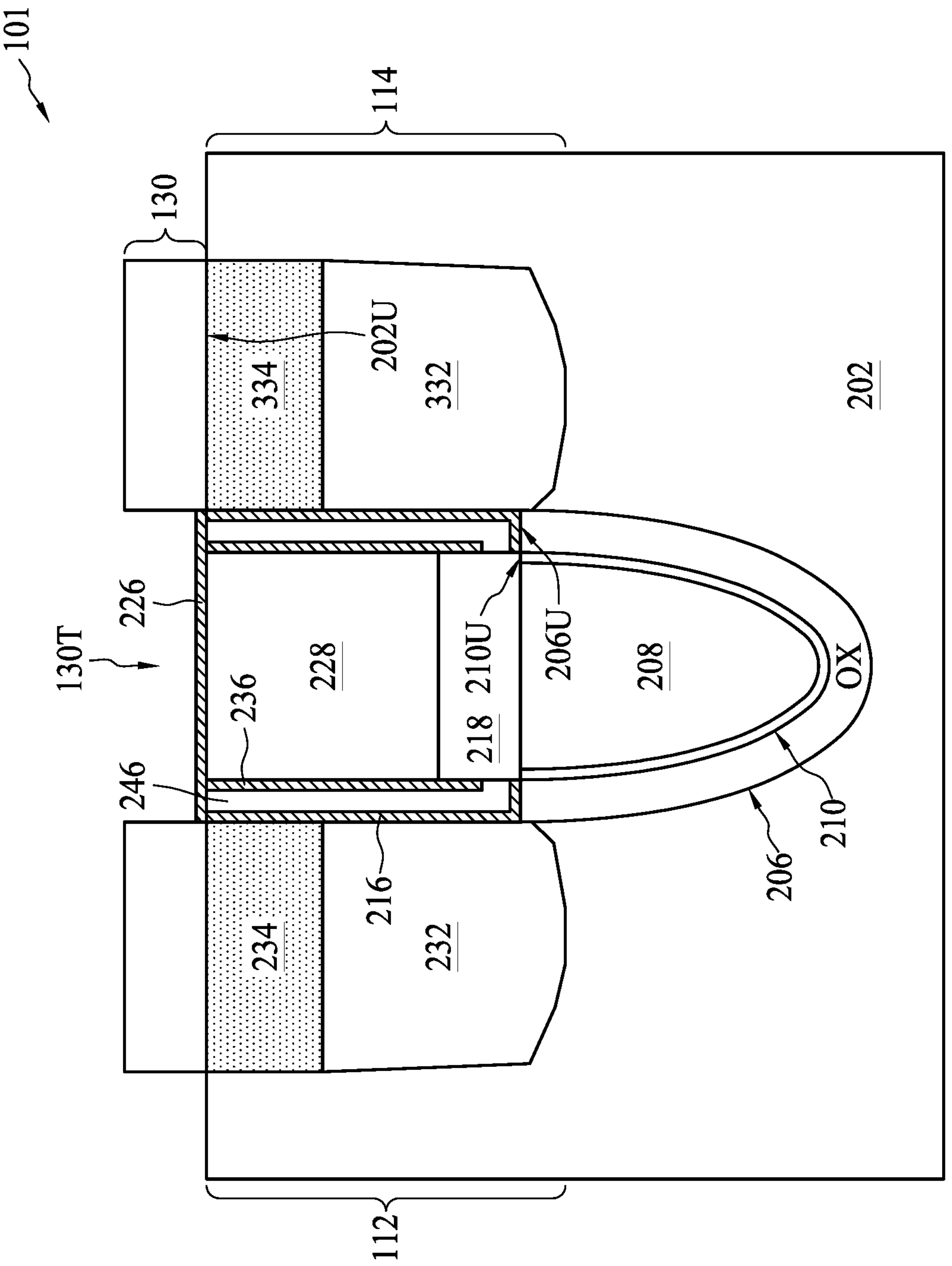

Referring to FIG. 4J, the third dielectric layer 226 is deposited over the upper surfaces of the second dielectric layer 216, the low-k layer 246, the fourth dielectric layer 236 and the capping layer 228. The deposition of the fourth dielectric layer 236 is similar to that described with reference to FIG. 3L.

Figure 4K:
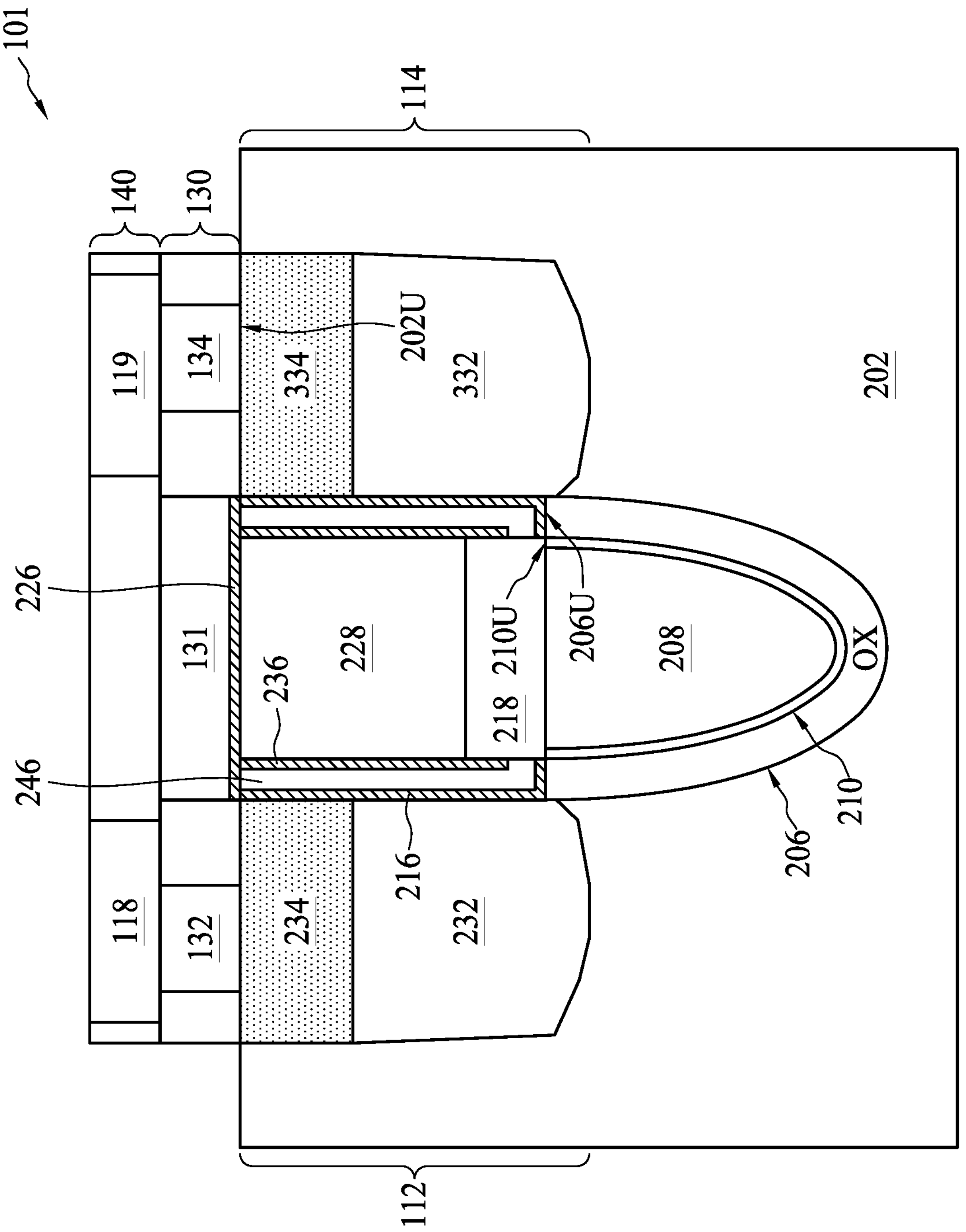

FIG. 4K illustrates the formation of the dielectric region 131, the conductive vias 132, 134, the second dielectric layer 140, and the conductive lines 118, 119. The formation of the dielectric region 131, the conductive vias 132, 134, the second dielectric layer 140, and the conductive lines 118, 119 is similar to that described with reference to FIGS. 3M and 3N.

Figure 5A:
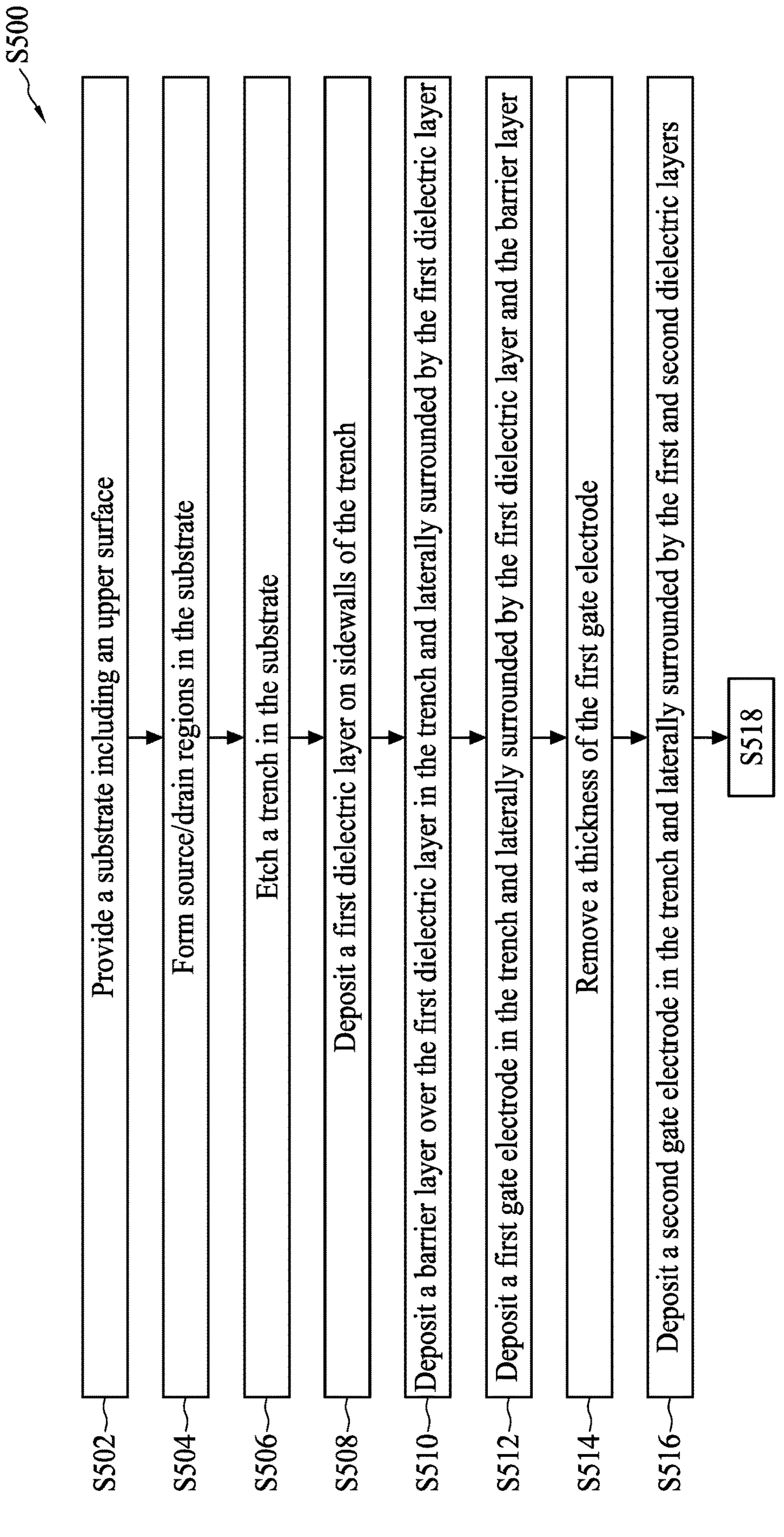
FIGS. 5A and 5B show a schematic flowchart of a method of manufacturing a memory cell, in accordance with some embodiments of the present disclosure.
Figure 5B:
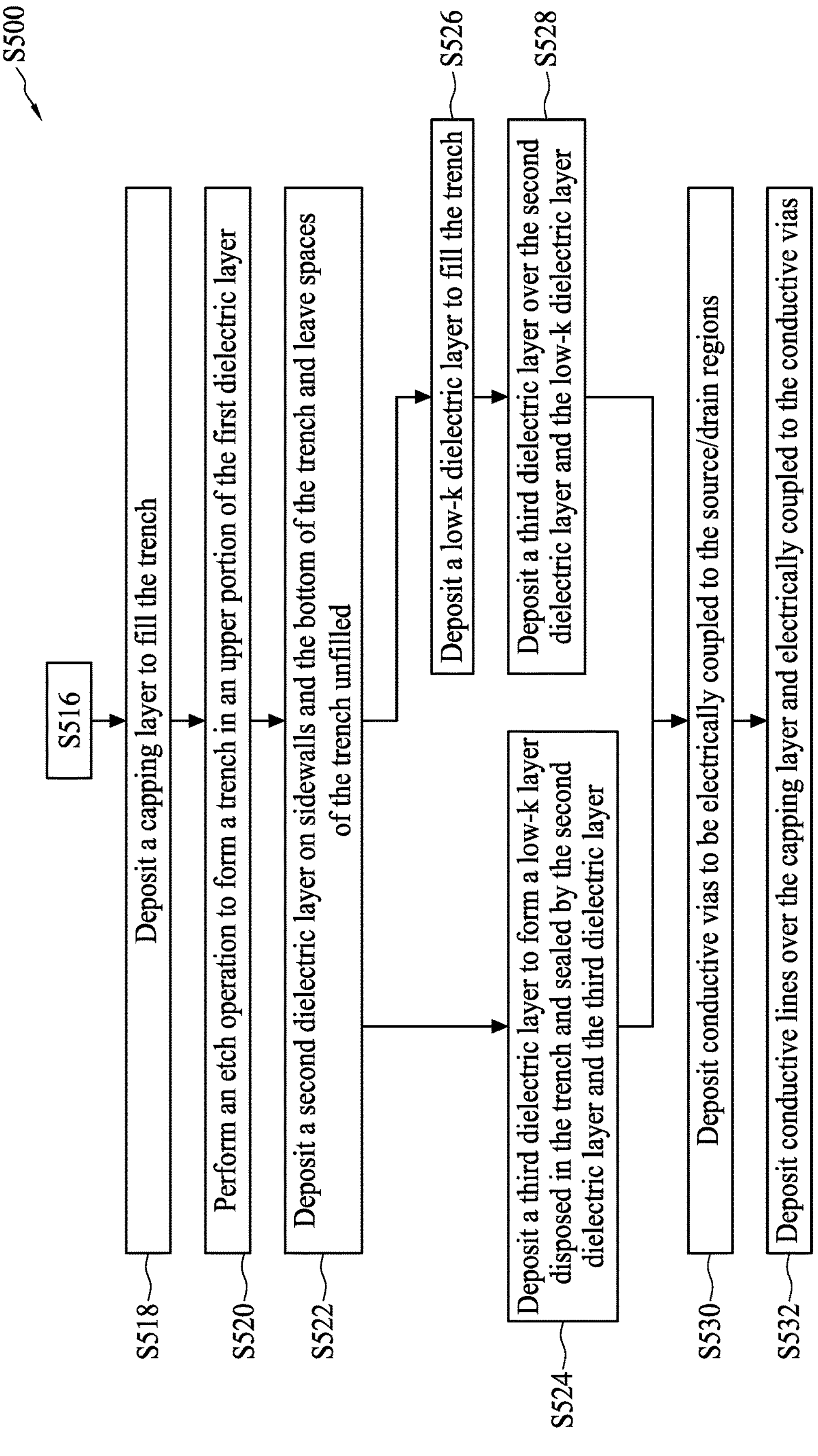

FIGS. 5A and 5B show a schematic flowchart of a method 500 of manufacturing a memory cell, in accordance with some embodiments of the present disclosure. It is understood that additional steps can be provided before, during, and after the steps shown by FIGS. 5A and 5B, and some of the steps described below can be replaced or eliminated for additional embodiments of the method 500. The order of the steps may be interchangeable.

At step S502, a substrate (e.g., substrate 102, 202) including an upper surface (e.g. upper surface 202U) is provided.

At step S504, source/drain regions (e.g., source/drain regions 112, 114) are formed in the substrate.

At step S506, a trench (e.g., trench 104T) is etched in the substrate.

At step S508, a first dielectric layer (e.g., first dielectric layer 106) is deposited on sidewalls of the trench.

At step S510, a barrier layer (e.g., barrier layer 210) is deposited in the trench and laterally surrounded by the first dielectric layer.

At step S512, a first gate electrode (e.g., first gate electrodes 122, 208) is deposited in the trench and laterally surrounded by, or surrounded from two sides of, the first dielectric layer.

At step S514, a thickness (e.g., height 128L) of the first gate electrode is removed. According to some embodiments of the present disclosure, step S514 is omitted from the method 500.

At step S516, a second gate electrode (e.g., second gate electrodes 124, 218) is deposited in the trench and laterally surrounded by, or surrounded from two sides of, the first dielectric layer and the barrier layer.

At step S518, a capping layer (e.g., capping layer 228) is performed to fill the trench.

At step S520, an etch operation is performed to form a trench (e.g., trench 206T) in an upper portion of the first dielectric layer. At step 522, a second dielectric layer (e.g., second dielectric layer 216) is deposited on sidewalls and the bottom of the trench and leave spaces of the trench unfilled.

At step S524, a third dielectric layer (e.g., third dielectric layer 226) is deposited over the trench to form a low-k layer (e.g., low-k layer 246) disposed in the trench and sealed by the second dielectric layer and the third dielectric layer. The low-k layer may be an air gap.

Alternatively, at step S526, a low-k dielectric layer (e.g., sacrificial layer 346) is deposited to fill the trench.

At step S528, a third dielectric layer (e.g., third dielectric layer 226) is deposited over the second dielectric layer and the low-k dielectric layer.

At step S530, conductive vias (e.g., conductive vias 132, 134) are deposited to be electrically coupled to the source/drain regions.

At step 532, conductive lines (e.g., conductive lines 118, 119) are deposited over the capping layer and electrically coupled to the conductive vias.

Figure 6A:
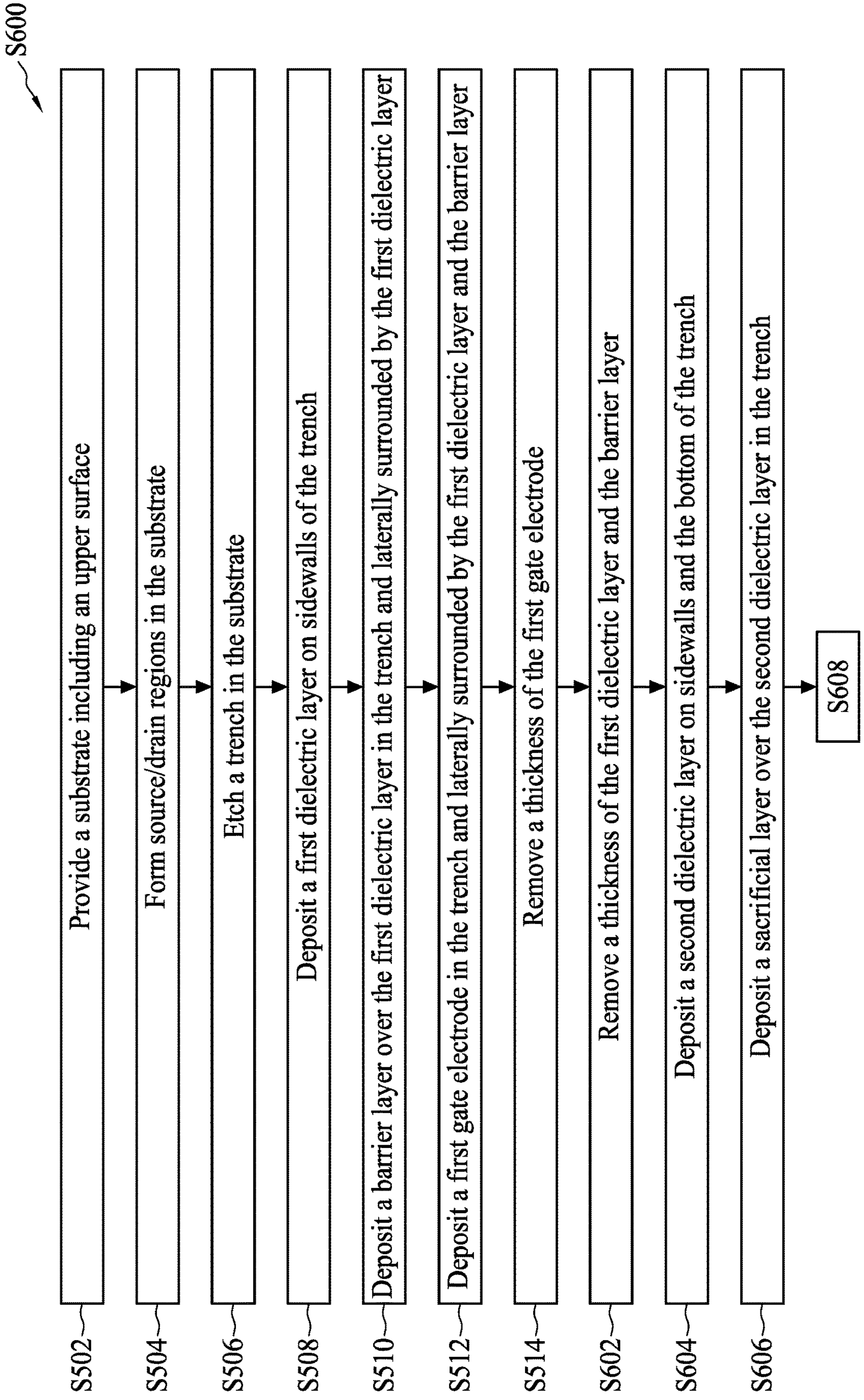
FIGS. 6A and 6B show a schematic flowchart of a method of manufacturing a memory cell, in accordance with some embodiments of the present disclosure.
Figure 6B:
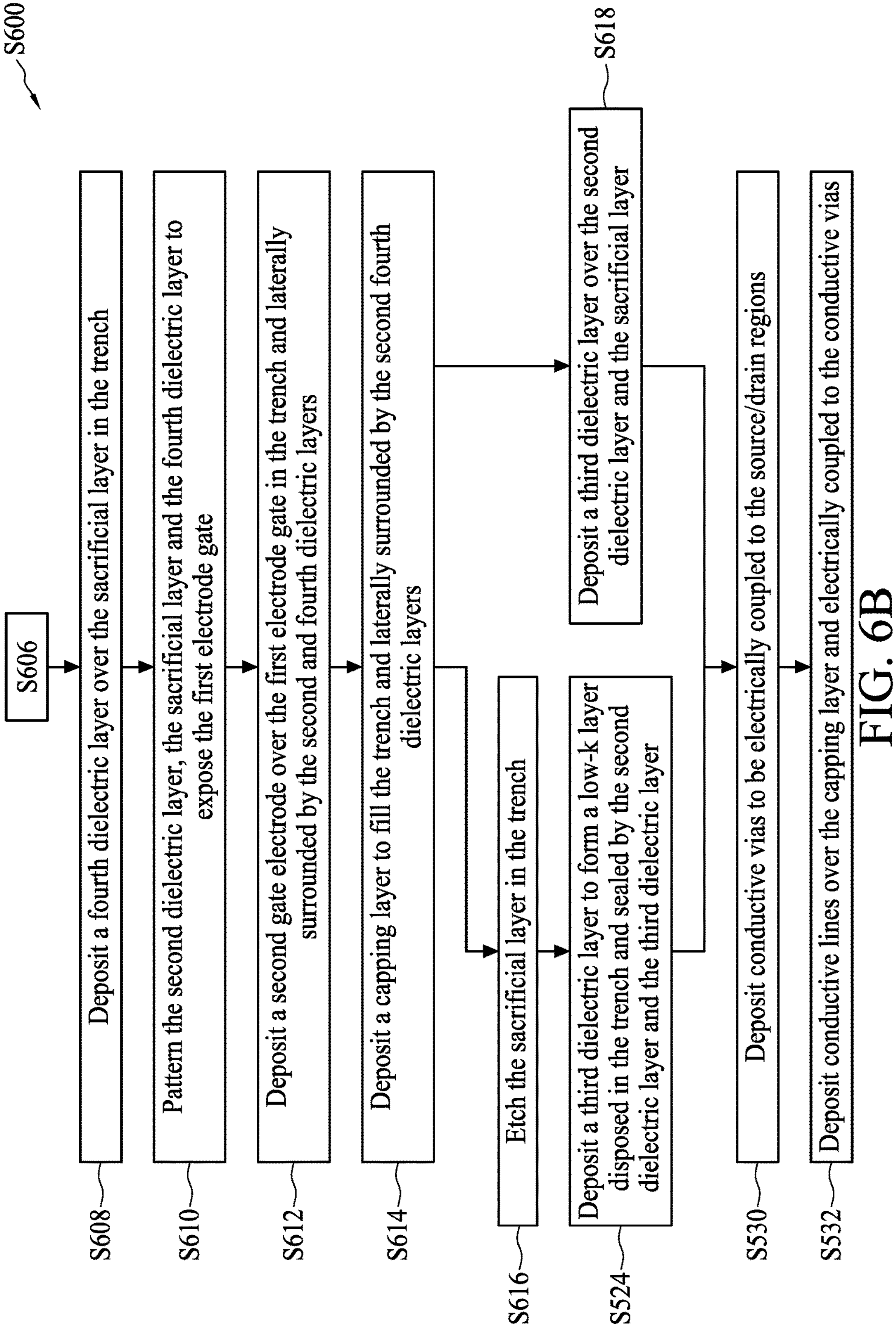

FIGS. 6A and 6B show a schematic flowchart of a method 600 of manufacturing a memory cell, in accordance with some embodiments of the present disclosure. It is understood that additional steps can be provided before, during, and after the steps shown by FIGS. 6A and 6B, and some of the steps described below can be replaced or eliminated for additional embodiments of the method 600. The order of the steps may be interchangeable. Some steps, e.g., steps S502, S504, S506, etc., shown in FIG. 6A, in the method 600 are similar to those shown in the method 500, and thus these steps share the labels with those in the method 500.

At step S502, a substrate (e.g. substrates 102, 202) including an upper surface (e.g. upper surface 202U) is provided. At step S504, source/drain regions (e.g., source/drain regions 112, 114) are formed in the substrate. At step S506, a trench (e.g., trench 104T) is etched in the substrate.

At step S508, a first dielectric layer (e.g., first dielectric layer 206) is deposited on sidewalls of the trench. At step S510, a barrier layer (e.g., barrier layer 210) is deposited in the trench and laterally surrounded by the first dielectric layer.

At step S512, a first gate electrode (e.g., first gate electrodes 122, 208) is deposited in the trench and laterally surrounded by, or surrounded from two sides of, the first dielectric layer. At step S514, a thickness (e.g., height 128L) of the first gate electrode is removed. According to some embodiments of the present disclosure, step S514 is omitted from the method 500.

At step 602, a thickness of the first dielectric layer and the barrier layer is removed.

At step 604, a second dielectric layer (e.g., second dielectric layer 216) is deposited on sidewalls and the bottom of the trench (e.g., trenches 104T, 208T).

At step 606, a sacrificial layer (e.g., sacrificial layer 346) is deposited over the second dielectric layer in the trench.

At step 608, a fourth dielectric layer (e.g., fourth dielectric layer 236) is deposited over the sacrificial layer in the trench.

At step 610, the second dielectric layer, the sacrificial layer and the fourth dielectric layer are patterned to expose the first gate electrode.

At step 612, a second gate electrode (e.g., second gate electrodes 124, 218) is deposited over the first gate electrode in the trench and laterally surrounded by the second and fourth dielectric layers.

At step 614, a capping layer (e.g., capping layer 228) is deposited to fill the trench and laterally surrounded by the second fourth dielectric layers.

At step 616, the sacrificial layer in the trench is etched. At step S524, a third dielectric layer (e.g., third dielectric layer 226) is deposited over the trench to form a low-k layer (e.g., low-k layer 426) disposed in the trench and sealed by the second dielectric layer and the third dielectric layer. The low-k layer may be an air gap.

Alternatively, at step S618, a third dielectric layer (e.g., third dielectric layer 226) is deposited over the second dielectric layer and the sacrificial layer.

At step S530, conductive vias (e.g., conductive vias 132, 134) are deposited to be electrically coupled to the source/drain regions. At step 532, conductive lines (e.g., conductive lines 118, 119) are deposited over the capping layer and electrically coupled to the conductive vias.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A memory device, comprising:

a substrate;

a first gate electrode arranged within the substrate;

a second gate electrode arranged within the substrate and in direct contact with the first gate electrode;

a gate dielectric layer separating the substrate from the first gate electrode and the second gate electrode from the substrate, wherein the gate dielectric layer comprises:

a first dielectric layer arranged within the substrate and laterally surrounding the first gate electrode;

a second dielectric layer over the first dielectric layer and laterally surrounding the second gate electrode;

a capping layer disposed on and in direct contact with the second gate electrode;

a low-k layer arranged over the first dielectric layer and laterally surrounded by the second dielectric layer, wherein the low-k layer has a dielectric constant less than that of the first dielectric layer or the second dielectric layer;

a third dielectric layer disposed on and in direct contact with an upper surface of the second dielectric layer, an upper surface of the capping layer, and an upper surface of the low-k layer; and a barrier layer laterally surrounding the first gate electrode and laterally surrounded by the low-k layer and the second dielectric layer, wherein the barrier layer is formed between the low-k layer and the capping layer and is formed between the first dielectric layer and the first gate electrode, wherein the barrier layer has a U-shaped cross section defining two upper ends in direct contact with a bottom surface of the second gate electrode;

wherein the low-k layer is formed between the second dielectric layer and the capping layer.

2. The memory device of claim 1, wherein the low-k layer comprises an air gap formed between the second dielectric layer and the capping layer, wherein the air gap has an opening formed between the upper surface of the second dielectric layer and the upper surface of the capping layer, such that the third dielectric layer is disposed on the low-k layer, wherein the opening of the air gap is directly sealed by the third dielectric layer.

3. The memory device of claim 1, wherein the third dielectric layer is disposed over and in direct contact with the low-k layer and the second dielectric layer and entirely covers the upper surface of the second dielectric layer, the upper surface of the capping layer, and the upper surface of the low-k layer.

4. The memory device of claim 3, wherein the upper surface of the capping layer is coplanar with the upper surface of the second dielectric layer.

5. The memory device of claim 1, further comprising a fourth dielectric layer between the capping layer and the low-k layer, wherein the fourth dielectric layer has a dielectric constant less than that of the first dielectric layer or the second dielectric layer, wherein the low-k layer is formed between the second dielectric layer and the fourth dielectric layer, wherein an upper surface of the fourth dielectric layer is entirely covered by the third dielectric layer, wherein the fourth dielectric layer is in direct contact between the capping layer and the low-k layer.

6. The memory device of claim 5, wherein the second dielectric layer and the fourth dielectric layer are formed of a same dielectric material.

7. The memory device of claim 3, wherein the third dielectric layer extends over and in direct contact with the upper surfaces of the low-k layer and the second dielectric layer.

8. The memory device of claim 3, wherein the third dielectric layer has a first thickness directly over the low-k layer and a second thickness directly over the second dielectric layer, wherein the first thickness is greater than the second thickness.

9. A memory device, comprising:

a substrate;

a first gate electrode arranged within the substrate;

a capping layer arranged within the substrate and over the first gate electrode;

a first dielectric layer laterally surrounding the capping layer;

a second dielectric layer laterally surrounding the capping layer and laterally surrounded by the first dielectric layer, wherein the first dielectric layer and the second dielectric layer are spaced apart from each other;

an air gap formed between the first dielectric layer and the second dielectric layer, wherein the air gap has an opening formed between an upper surface of the first dielectric layer and an upper surface of the second dielectric layer, wherein the opening of the air gap is positioned at a same horizontal level of an upper surface of the capping layer;

a fourth dielectric layer disposed on and in direct contact with the upper surface of the first dielectric layer, the upper surface of the second dielectric layer, and the upper surface of the capping layer to seal the opening of the air gap; and a second gate electrode arranged between and in direct contact with the first gate electrode and the capping layer, wherein the second gate electrode is in fluid communication with the air gap below the second dielectric layer, wherein the first dielectric layer is in direct contact with a sidewall of the second gate electrode, wherein a bottom surface of the second dielectric layer is positioned below a top surface of the second gate electrode.

10. The memory device of claim 9, wherein the first dielectric layer has a dielectric constant greater than that of the second dielectric layer.

11. The memory device of claim 10, wherein the second dielectric layer comprises silicon-carbon oxide.

12. The memory device of claim 9, wherein the air gap extends below the second dielectric layer and separates the first dielectric layer from the second dielectric layer, wherein a bottom surface of the first dielectric layer is positioned below a bottom surface of the second dielectric layer, such that the air gap is formed not only between the first dielectric layer and the second dielectric layer but also below the bottom surface of the second dielectric layer.

13. The memory device of claim 9, wherein a lower surface of the second gate electrode is coplanar with a bottom surface of the first dielectric layer, wherein the upper surface of the capping layer, the upper surface of the first dielectric layer, and the upper surface of the second dielectric layer are coplanar with each other.

14. The memory device of claim 9, further comprising a third dielectric layer below the first dielectric layer, the second dielectric layer and the second gate electrode, and laterally surrounding the first gate electrode, wherein the first dielectric layer has an L-shaped cross section defining an upper vertical portion parallel to the second dielectric layer and a lower horizontal portion in direct contact with the third dielectric layer, wherein the second dielectric layer and the third dielectric layer are separated by the air gap.

15. The memory device of claim 14, further comprising a barrier layer between the third dielectric layer and the first gate electrode, wherein an upper surface of the third dielectric layer is coplanar with an upper surface of the barrier layer.

16. The memory device of claim 15, wherein the barrier layer is arranged below the first dielectric layer and is covered by the first dielectric layer.

17. The memory device of claim 9, further comprising a source/drain region disposed in the substrate on one side of the first dielectric layer, wherein the source/drain region has a bottom lower than a lower surface of the first dielectric layer.

* * * * *